United States Patent [19]

Fitingof

[11] Patent Number: 5,099,237
[45] Date of Patent: Mar. 24, 1992

[54] METHOD AND APPARATUS FOR PROVIDING MAXIMUM RATE MODULATION OR COMPRESSION ENCODING AND DECODING

[75] Inventor: Boris Fitingof, Tucson, Ariz.

[73] Assignee: Research Corporation Technologies, Inc., Tucson, Ariz.

[21] Appl. No.: 550,505

[22] Filed: Jul. 10, 1990

[51] Int. Cl.$^5$ .................... H03M 7/42; H03M 7/46
[52] U.S. Cl. .................... 341/59; 341/67; 341/106
[58] Field of Search .................... 341/59, 67, 106, 50

[56] References Cited

U.S. PATENT DOCUMENTS

| | | | |
|---|---|---|---|
| 3,689,899 | 9/1972 | Franaszek | 341/67 X |
| 3,925,780 | 12/1975 | Van Voorhis . | |
| 4,075,622 | 2/1978 | Lawrence et al. | 341/67 X |
| 4,115,768 | 9/1978 | Eggenberger et al. | 341/67 X |
| 4,146,909 | 3/1979 | Beckenhauer et al. . | |
| 4,413,251 | 11/1983 | Adler et al. . | |
| 4,517,552 | 5/1985 | Shirota et al. . | |
| 4,547,890 | 10/1985 | Gindi . | |
| 4,707,681 | 11/1987 | Eggenberger et al. . | |
| 4,804,969 | 2/1989 | Makasani et al. | 341/59 |
| 4,816,805 | 3/1989 | Yojir et al. | 341/83 |
| 4,833,470 | 5/1989 | Iketani | 341/59 |

FOREIGN PATENT DOCUMENTS 0314512 5/1989 European Pat. Off. .

OTHER PUBLICATIONS

*Magnetic Recording,* vol. 2: Computer Data Storage, edited by C. Denis Mec and Eric E. Daniel, McGraw Hill, New York (1988), Chapter 5, pp. 243-304.

*IEEE Transactions on Information Theory,* "Enumerative Source Encoding", Thomas A. Cover, vol. IT-19, No. 1, Jan. 1973, pp. 73-77.

*Primary Examiner*—A. D. Pellinen
*Assistant Examiner*—Sharon D. Logan
*Attorney, Agent, or Firm*—Dickstein, Shapiro & Morin

[57] ABSTRACT

A method and apparatus for providing maximum rate modulation or compression encoding and decoding for use with magnetic and optical recording and optical fiber communications is disclosed in which primarily two algorithms are utilized which satisfy the conditions that encoding and decoding require only a small constant number of elementary operations, without multiplications or divisions and that only a small amount of memory space for a small number of integers is required. Thus, the present invention operates with only linear time complexity and only linear memory complexity. The invention utilizes a direct enumeration algorithm to accomplish a mapping and an inverse enumeration algorithm to accomplish an inverse mapping back to enumeration.

10 Claims, 17 Drawing Sheets (d,k): d=2, k=5, s = 0,1,......|S|−1 OR "FORBIDDEN" (F), |S|=6

| CURRENT STATE s | NEXT STATE s FOR TRANSITION BIT "0" | NEXT STATE s FOR TRANSITION BIT "1" |
|---|---|---|
| 0 | 1 | F |
| 1 | 2 | F |
| 2 | 3 | 0 |
| 3 | 4 | 0 |
| 4 | 5 | 0 |
| 5 | F | 0 |

FIG.1

(d,k): d=2, k=5, CODEWORD LENGTH L=12, I=12, SOURCE BLOCK LENGTH N = ⌊Log I⌋, NUMBER OF CODEWORDS = $2^{\lfloor \log I \rfloor}$ = 8

| ALL POSSIBLE INPUT WORDS (SOURCE BLOCKS) IN LEXICOGRAPHIC ORDER | ALL I WORDS SATISFYING THE GIVEN CONSTRAINTS IN LEXICOGRAPHIC ORDER | LEXICOGRAPHIC NUMBERS |
|---|---|---|
| 000 | 000001000001 | 0 |
| 001 | 000001001001 | 1 |
| 010 | 000010001001 | 2 |
| 011 | 000010010001 | 3 |
| 100 | 000100001001 | 4 |
| 101 | 000100010001 | 5 |
| 110 | 000100100001 | 6 |
| 111 | 0001000001001 | 7 |
|  | 001000010001 | 8 |
|  | 001000100001 | 9 |
|  | 001001000001 | 10 |
|  | 001001001001 | 11 |

FIG.2

| (d,k): d=2, k=5, WORD LENGTH L=12 |||||||
| STATES s \ l | 0 | 1 | 2 | 3 | 4 | 5 |
|---|---|---|---|---|---|---|
| 0 | 12 | | | | | |
| 1 | | 12 | | | | |
| 2 | 5 | | 7 | | | |
| 3 | 3 | 5 | 3 | 4 | | |
| 4 | 2 | 3 | 2 | 2 | 2 | |
| 5 | 2 | 2 | 1 | 1 | 1 | 0 |
| 6 | 1 | 1 | 1 | 1 | 1 | 1 |
| 7 | 1 | 1 | 1 | 0 | 0 | 0 |
| 8 | | 1 | 1 | 1 | 0 | 0 |
| 9 | 1 | | | 1 | 1 | 0 |
| 10 | 1 | | | | 0 | 0 |
| 11 | | | 0 | 0 | 0 | 0 |

FIG.4

| WORDS SATISFYING GIVEN CONSTRAINTS | CALCULATION OF LEXICOGRAPHIC NUMBERS |
|---|---|
| 000001000001 | 0+0+0+0+0+0+0+0+0+0+0 = 0 |
| 000001001001 | 0+0+0+0+0+0+0+0+1+0+0+0 = 1 |
| 000010001001 | 0+0+0+0+0+2+0+0+0+0+0+0 = 2 |
| 000010010001 | 0+0+0+0+0+2+0+0+0+1+0+0+0 = 3 |
| 000100001001 | 0+0+0+0+4+0+0+0+0+0+0+0 = 4 |
| 000100010001 | 0+0+0+0+4+0+0+0+1+0+0+0 = 5 |
| 000100100001 | 0+0+0+0+4+0+2+0+0+0+0+0 = 6 |
| 001000001001 | 0+0+7+0+0+0+0+0+0+0+0+0 = 7 |
| 001000010001 | 0+0+7+0+0+0+0+0+1+0+0+0 = 8 |
| 001000100001 | 0+0+7+0+0+0+2+0+0+0+0+0 = 9 |
| 001001000001 | 0+0+7+0+0+0+3+0+0+0+0+0 = 10 |
| 001001001001 | 0+0+7+0+0+0+3+0+0+1+0+0 = 11 |

(d,k): d=2, k=5, WORD LENGTH L=12

FIG.5

USING FOR DATA COMPRESSION

FIG. 17 il – INPUT BLOCK LENGTH, ol – OUTPUT OR CODEWORD LENGTH

| CODE (d,k) | ALGORITHMS WITH ERROR PROPAGATION | | | | | | ALGORITHMS WITHOUT ERROR PROPAGATION | | | PUBLISHED RESULTS FOR KNOWN CODES | |
|---|---|---|---|---|---|---|---|---|---|---|---|
| | FF | | | FV | | | FF | | | | |
| | RATE | il | ol | RATE | il | ol (MAX) | RATE | il | ol | CAPACITY | RATE |
| 0 3 | 0.909 | 30 | 33 | 0.931085 | 28 | 31 | 0.9032 | | 31 | 0.947 | 8/9 |
| 1 3 | 0.526 | 30 | 57 | 0.546748 | 29 | 54 | 0.5254 | | 31 | 0.552 | 1/2 |
| 1 6 | 0.638 | 30 | 47 | 0.664866 | 31 | 48 | 0.6326 | | 31 | 0.669 | 2/3 |
| 1 7 | 0.651 | 28 | 43 | 0.667579 | 31 | 48 | 0.6323 | | 31 | 0.679 | 2/3 |
| 2 7 | 0.4915 | 29 | 59 | 0.511957 | 16 | 33 | 0.476923 | | 31 | 0.517 | 1/2 |
| 3 7 | 0.39189 | 29 | 74 | 0.40364 | 31 | 79 | 0.37399 | | 31 | 0.406 | 2/5 |
| 4 9 | 0.3488 | 30 | 86 | 0.359859 | 30 | 86 | 0.329787 | | 31 | 0.362 | 1/3 |
| 5 17 | 0.3376 | 26 | 77 | 0.352684 | 26 | 77 | 0.319588 | | 31 | 0.356 | 1/3 |
| 0 3 | | | | | | | 0.943359 | | 512 | 0.947 | 8/9 |
| 1 3 | | | | | | | 0.546875 | | 512 | 0.552 | 1/2 |
| 1 6 | | | | | | | 0.664063 | | 512 | 0.669 | 2/3 |
| 1 7 | | | | | | | 0.675781 | | 512 | 0.679 | 2/3 |
| 2 7 | | | | | | | 0.511713 | | 512 | 0.517 | 1/2 |
| 3 7 | | | | | | | 0.400391 | | 512 | 0.406 | 2/5 |
| 4 9 | | | | | | | 0.355469 | | 512 | 0.362 | 1/3 |
| 5 17 | | | | | | | 0.347656 | | 512 | 0.356 | 1/3 |

| K | DOPT | COPT | BEST D | BEST C |
|---|------|------|--------|--------|
| 2 | 0.3840 | 0.9227 | 0 | 0.8791 |
| 3 | 0.9030 | 1.1047 | 1 | 1.1029 |
| 4 | 1.4365 | 1.2597 | 1 | 1.2349 |
| 5 | 1.9813 | 1.3949 | 2 | 1.3949 |
| 6 | 2.5352 | 1.5151 | 3 | 1.4983 |
| 7 | 3.0968 | 1.6233 | 3 | 1.6227 |
| 8 | 3.6649 | 1.7218 | 4 | 1.7161 |
| 9 | 4.2388 | 1.8123 | 4 | 1.8100 |
| 10 | 4.8177 | 1.8960 | 5 | 1.8948 |
| 11 | 5.4010 | 1.9739 | 5 | 1.9690 |
| 12 | 5.9885 | 2.0467 | 6 | 2.0467 |
| 13 | 6.5796 | 2.1152 | 7 | 2.1110 |
| 14 | 7.1741 | 2.1797 | 7 | 2.1791 |
| 15 | 7.7716 | 2.2409 | 8 | 2.2399 |
| 16 | 8.3720 | 2.2989 | 8 | 2.2966 |
| 17 | 8.9751 | 2.3541 | 9 | 2.3541 |
| 18 | 9.5807 | 2.4068 | 10 | 2.4043 |
| 19 | 10.1886 | 2.4572 | 10 | 2.4567 |
| 20 | 10.7987 | 2.5055 | 11 | 2.5050 |
| 21 | 11.4108 | 2.5519 | 11 | 2.5501 |
| 22 | 12.0249 | 2.5965 | 12 | 2.5964 |
| 23 | 12.6408 | 2.6394 | 13 | 2.6382 |
| 24 | 13.2584 | 2.6808 | 13 | 2.6803 |
| 25 | 13.8778 | 2.7208 | 14 | 2.7207 |
| 26 | 14.4987 | 2.7595 | 14 | 2.7577 |
| 27 | 15.1211 | 2.7970 | 15 | 2.7969 |
| 28 | 15.7450 | 2.8333 | 16 | 2.8329 |
| 29 | 16.3702 | 2.8685 | 16 | 2.8677 |
| 30 | 16.9968 | 2.9027 | 17 | 2.9027 |
| 31 | 17.6247 | 2.9360 | 18 | 2.9352 |
| 32 | 18.2538 | 2.9683 | 18 | 2.9679 |
| 33 | 18.8841 | 2.9997 | 19 | 2.9997 |
| 34 | 19.5156 | 3.0304 | 20 | 3.0293 |
| 35 | 20.1481 | 3.0603 | 20 | 3.0602 |
| 36 | 20.7817 | 3.0894 | 21 | 3.0892 |
| 37 | 21.4164 | 3.1179 | 21 | 3.1172 |
| 38 | 22.0520 | 3.1457 | 22 | 3.1457 |
| 39 | 22.6886 | 3.1726 | 23 | 3.1725 |
| 40 | 23.3262 | 3.1994 | 23 | 3.1990 |
| 41 | 23.9646 | 3.2254 | 24 | 3.2253 |
| 42 | 24.6040 | 3.2508 | 25 | 3.2503 |
| 43 | 25.2442 | 3.2757 | 25 | 3.2755 |
| 44 | 25.8852 | 3.3000 | 26 | 3.3000 |
| 45 | 26.5271 | 3.3239 | 27 | 3.3233 |
| 46 | 27.1697 | 3.3474 | 27 | 3.3473 |
| 47 | 27.8131 | 3.3704 | 28 | 3.3703 |
| 48 | 28.4573 | 3.3929 | 28 | 3.3924 |
| 49 | 29.1022 | 3.4151 | 29 | 3.4150 |

FIG.18

METHOD AND APPARATUS FOR PROVIDING MAXIMUM RATE MODULATION OR COMPRESSION ENCODING AND DECODING

BACKGROUND OF THE INVENTION

The present invention relates generally to a method of and apparatus for providing encoding and decoding for either modulation coding or data compression for the storage and communication of digital data. Particularly, the present invention relates to a method of and apparatus for providing modulation coding of digital data for use with magnetic and optical recording and optical fiber communication and to a method of and apparatus for providing data compression for storage of text information in natural or programming languages.

The present invention provides a practical way in which to approach Shannon's theoretical rate limit for constraints on encoded data for modulation coding and for constraints on data to be encoded by data compression, where such constraints are defined by any state transition table. In the case of modulation coding, Shannon's theoretical limit is the capacity of his noiseless constrained channel. See: C.E. Shannon, "Mathematical Theory of Communications," University of Illinois Press, 1963. The present invention provides a particularly effective method and apparatus for modulation coding for any run-length-limiting (d,k) constraints, or any (d,k;c) constraints, as well as for any (d,k) or (d,k;c) constraints used with a synchronization word. The present invention may also be used with simple post modulation error-control codes incorporated into the state transition table of the invention itself.

The use of modulation codes in magnetic and optical data storage systems is widespread and the advantages of modulation coding are well known. For example, in U. S. Pat. No. 3,689,899, a run-length limited variable length code is disclosed.

In magnetic and optical binary recording, a 1 is usually represented by a transition between the up and down states of the recording waveform, while a 0 is represented by no change or transition in the waveform. However, an unconstrained sequence of 1's and 0's is not desirable in practice. For example, physical factors, such as the separation between successive transitions on the recording medium and the gap-width of the magnetic recording head or the wavelength of light in optical recording, determine the minimum allowed number of zeroes (d) between successive ones. On the other hand, a long sequence of uninterrupted 0's results in a loss of synchronization when the data is self-clocking. This synchronization problem determines the maximum number of zeroes (k) between successive ones. Modulation codes satisfying these run length limiting constraints are known as run-length-limited (RLL) modulation (d,k) codes.

Also, the imbalance between the up and down states of the recording waveform may result in a significant charge accumulation in the electronic circuitry which results in forcing the system beyond acceptable levels of operation. Therefore, the implementation of such run-length-limited codes can require, as additional constraints, a maximum allowed absolute value (c) of the difference between the number of zeroes and ones in any sequence of bits to be recorded. Run-length-limited (RLL) codes satisfying such additional constraints are known as (d,k,c) codes.

The objective of any modulation coding is to create a one-to-one correspondence between sequences of user data, which are usually streams of binary digits, and constrained binary sequences. The nature of the constraints imposed upon the modulation signal must be determined by the system designer and is dependent upon the particular characteristics of the system under consideration.

If a synchronization word is used, then additional constraints are placed on the modulation code such that the synchronization word cannot occur in successive bits of data unless those bits constitute the synchronization word in its intended location.

If there are no constraints on the minimum run-length of 0's, that is, if d equals 0, then each modulation bit will occupy one interval of length $\Delta$, where $\Delta$ is the minimum allowed distance between transitions. Since the number of modulation bits is always greater than the number of data bits, the overall recording density will become less than 1 data bit per $\Delta$. If, on the other hand, d is not equal to 0, then d+1 modulation bits can be packed in every interval of length $\Delta$.

When the code parameters are properly chosen, the higher density of modulation bits can translate into a higher density recording of data bits. In that manner, the overall density can become greater than 1 data bit per $\Delta$. However, the cost of such an increase in capacity is the reduced period of time available to each modulation bit. If t is defined as the time that the read/write head dwells on an interval of length $\Delta$, then the time window available to each modulation bit will be t/(d+1).

Any of the sets of constraints discussed above, or all of them together, and any other modulation constraints can be represented by a corresponding state transition table. A state transition table is an $|S| \times |B|$ matrix, where $|S|$ is the number of states of a finite automation and $|B|$ is the number of possible transition symbols. Each element $z_{s,b}$ of that matrix is either the state to which the automation goes by the transition symbol b from the state s or is a symbol signifying that the transition described by the symbol b is forbidden; that is, the transition by symbol b from state s is not permitted by the modulation constraints. FIG. 1 shows an example of such a state transition table for (2,5) RLL constraints where a state is equal to the number of zeroes after the last "1" bit.

The constrained noiseless channel discussed above has been defined by Shannon as any set of constraints on encoded data (which need not necessarily be binary) characterized by any state transition diagram; the notion of constraints defined by such transition diagram is equivalent to the notion of constraints defined by the state transition table mentioned above. Shannon defined the capacity of such a channel as the theoretical limit of the rate N/L of coding for those constraints, for an information source block of length N and a codeword of length L→∞. He also proposed a way in which to calculate that capacity for any state transition diagram. However, prior to the present invention, general nonexponential complexity methods of modulation coding with a rate approaching that capacity have not been known.

The present invention provides a method of and apparatus for encoding and decoding with only linear complexity with a rate approaching Shannon's capacity for any constrained noiseles channel; that is, for modulation constraints defined by any state transition table or by any state transition function.

While run-length-limited (d,k) codes and (d,k;c) codes in general are known, they are only known for few (d,k;c) combinations. Some such codes, and probably the most practical ones, are characterized in Table 1. See the Chapter by Arvind M. Patel in C. Denis Mee and Eric D. Daniel's "Magnetic Recording," Vol. II, McGraw-Hill Book Company, 1988, p. 247.

TABLE 1

Rates of some known run-length-limited (d,k) and (d,k;c) codes in comparison to Shannon's information capacities of noiseless channels with corresponding run-length-limiting (d,k) or (d,k;c) constraints.

| d | k | c | Capacity | $\geq$ | rate |
|---|---|---|----------|--------|------|
| 0 | 3 | — | 0.947 | > | 8/9 |
| 1 | 3 | — | 0.552 | > | $\frac{1}{2}$ |
| 1 | 3 | 3 | 0.500 | = | $\frac{1}{2}$ |
| 1 | 6 | — | 0.699 | > | $\frac{2}{3}$ |
| 1 | 7 | — | 0.679 | > | $\frac{2}{3}$ |
| 1 | 7 | 10 | 0.668 | > | $\frac{2}{3}$ |
| 2 | 7 | — | 0.517 | > | $\frac{1}{2}$ |
| 2 | 7 | 8 | 0.501 | > | $\frac{1}{2}$ |
| 2 | 8 | 7 | 0.503 | > | $\frac{1}{2}$ |
| 3 | 7 | — | 0.406 | > | 2/5 |
| 4 | 9 | — | 0.362 | > | $\frac{1}{3}$ |
| 5 | 17 | — | 0.337 | > | $\frac{1}{3}$ |

Furthermore, only a small number of known (d,k) and (d,k,c) codes have been used commercially. For example, the effective (2,7) RLL code is known and is extensively utilized, but effective (2,7;c) RLL codes are not known. Very few of those utilized (d,k) combinations are optimal. In addition, these known codes from Table 1 are of very different natures. For example, the (2,7) RLL code is defined by a small table of variable-to-variable length coding (but with a fixed rate), whereas the (0,3) RLL code is defined by a large table of fixed-to-fixed length coding. See U.S. Pat. No. 3,689,899, referenced above and Patel, A.M., "Improved Encoder and Decoder for a Byte-Oriented (0,3) 8/9 Code," IBM Technical Disclosures, Vol.28, 546 (1985). An (1,7) RLL code is defined by two mappings. See Horiguchi, T. and K. Morita, "An Optimization of Modulation Codes in Digital Recording," IEEE Trans. on Magn., MAG-12, 740 (1976).

The absence of a systematic and effective way for finding modulation codes has been a major obstacle to the development of systems of magnetic and optical recording with higher storage densities. That obstacle is overcome by the present invention which, in contrast with the prior art, provides an efficient way of producing modulation encoding for modulation constraints defined by any state transition table with maximum possible rate for the given modulation requirements. In particular, the present invention provides such kind of modulation encoding and decoding for any (d,k) and (d,k;c) constrains, any (d,k) and (d,k;c) constraints with an arbitrary synchronization word, or for both of those cases using simple error-correcting codes incorporated in the state transition table. The application of the present invention is similar for use in both magnetic and optical recording and in optical fiber communication.

If modulation encoding is used as decoding and modulation decoding is used as encoding, then the method and apparatus of the present invention provide effective data compression for the general case of information source data constraints defined by an arbitrary state transition table, instead of modulation coding for modulation constraints defined by the same state transition table. While in the past general methods of effective data compression for information source constraints have not been known, the present invention discloses general methods of effective data compression for information source constraints defined by any state transition table.

For the objectives described above the present invention utilizes the first known algorithms both for enumeration of any set of words described by constraints defined by any state transition table and for inverse mapping. An enumeration algorithm forms the main part of the modulation decoding algorithm and of the data compression encoding algorithm. Conversely, the inverse mapping algorithm forms the main part of the modulation encoding algorithm and of the data compression decoding algorithm. Algorithms which provide either enumeration or inverse mapping for any given state transition table (or for a broad class of such tables) and a given initial state were not known prior to this invention. Particularly, algorithms which provide such functions for a class of state transition tables corresponding to (d,k) codes were not known prior to the instant invention.

According to one main method of this invention, after the state transition table corresponding to a given set of constraints has been constructed, the block length L of the modulation codewords is determined. The present invention can handle any choice of L, although longer codewords are preferred since they yield a capacity which is arbitrarily close to Shannon's noiseless channel capacity for the given set of constraints. The main encoding and decoding algorithms of the present invention are based upon enumeration and mapping blocks of user data of fixed length N to modulation codewords of fixed length L.

The instant invention provides many advantages over known methods for encoding and decoding information on optical and magnetic disks. For example, information rates using the present invention, and hence storage densities, are arbitrarily close to capacity (the theoretical rate limit approached by growing lengths of codewords) for practically any set of constraints on allowed encoded sequences. These constraints can be entered as input in the form of a state transition table. Such closeness to capacity is achieved for all sets of constraints using the invention disclosed herein. Any new or additional set of constraints are entered as a new or additional input in the form of a state transition table without changing the method of the present invention.

If synchronization properties are required, then they can be easily and independently introduced with a negligible decrease in the information rate. That can be accomplished by adding a set of new constraints which correspond to the addition of a synchronization word.

Run-length-limiting and practically any other constraints that define modulation codes without error-correcting properties (or with simple error-correcting properties) can be described by state transition tables of size 2S where S denotes the number of states. For a (d,k) code, $|S|=k+1$. An array of size $L\times|S|\times 2$, where L is the codeword length, is produced from this table a single time for all codings and decodings corresponding to this table. It is an advantage of the present invention that this is almost the only memory used by the invention for coding and decoding and that it can be stored in ROM. In contrast, the memory required by a lookup code table is much larger, being of the order of $2^L$. In addition, the method and apparatus of the present invention uses only a few operations per bit of data, both for encoding and decoding, and does not require multiplication or division.

In order to implement the synchronization properties of the present invention, an additional state transition table of size $2|S'|$, determined by the properties of a desired synchronization word, can be implemented. That will produce an array of size $L \times |S| \times |S'| \times 2$, which again need only be produced once for all encodings and decodings that use that synchronization word. If the synchronization word is taken as a sequence of $k+1$ zeroes for $(d,k)$ codes, then the $(d,k)$ code with such synchronization word becomes a $(d,k+1)$ code.

SUMMARY AND OBJECTS OF THE INVENTION

In view of the foregoing, it should be apparent that there still exists a need in the art for a method of and apparatus for providing more effective modulation coding or data compression of digital data for use with magnetic and optical recording and optical fiber communication. It is, therefore, a primary object of this invention to provide a method of and apparatus for effective modulation coding for any run-length-limiting $(d,k)$ constraints or $(d,k;c)$ constraints.

It is an object of this invention to provide a method of and apparatus for coding-decoding which can be used to provide effective data compression of information source data defined by an arbitrary state transition table.

It is also an object of the present invention to provide a method of and apparatus for the enumeration of any set of words described by constraints defined by any state transition table and for inverse mapping.

Another object of the present invention is to provide a method of and apparatus for modulation coding which is reliable and relatively inexpensive to implement.

A further object of the present invention is to provide a method of and apparatus for producing and utilizing encoding-decoding pairs for modulation coding whose rates approach Shannon's theoretical limit for constraints defined on encoded data by any state transition table or state transition function.

Another object of the present invention is to provide such encoding-decoding pairs for modulation of any run-length-limiting $(d,k)$ constraints or $(d,k;c)$ constraints, for any $(d,k)$ pairs or $(d,k;c)$ combinations, and especially for optimal $(d,k)$ pairs and $(d,k,c)$ combinations.

Another object of the invention is to provide such encoding-decoding pairs with any arbitrary synchronization word.

It is a further object of the present invention to provide such a method of and apparatus for encoding and decoding that require only a small constant number of elementary operations, without multiplications or divisions, and which require memory storage for only a small number of integers.

It is a still further object of the present invention to provide such a method of and apparatus for producing the modulation coding of maximum rate possible for any given fixed length L of codewords with modulation and other constraints defined by any state transition table, so that coding is of the fixed-to-fixed length type without error propagation, utilizing the same initial and final state.

It is another object of the present invention to provide a method of and apparatus for producing the modulation coding of maximum rate possible for any given fixed length L of codewords, with constraints defined by any state transition table so that coding is of the fixed-to-fixed length type with error propagation, and in which the initial state of the following codeword is not equal to the final state of the previous codeword.

It is yet another object of the present invention to provide a method of and apparatus for producing the modulation coding of maximum rate possible for any given length of information source blocks to be encoded, with constraints defined by any state transition table, so that coding is of the fixed-to-variable length type with error propagation, in which the initial state of a following codeword is equal to the final state of the previous codeword and in which codewords of the same initial state are of fixed length.

It is a still further object of the present invention to provide a method of and apparatus for producing fixed-to-fixed or fixed-to-variable length data compression encoding-decoding for constraints defined on data to be encoded by any state transition table, with the maximum possible rate for a given length of information source blocks.

It is yet another object of the present invention to provide a method for the calculation of the rate for all cases of modulation coding or data compression coding and for calculating the rate limit when the length of coding increases.

Briefly described, these and other objects of the invention are accomplished in accordance with the method and apparatus of the invention which utilize primarily two algorithms (enumeration and inverse enumeration) which satisfy the requirements that encoding and decoding require only a small constant number of elementary operations, without multiplications or divisions, and that only memory space for storage of a small number of integers is required. Furthermore, the invention operates with only linear time complexity and only linear memory complexity with respect to the length of codewords.

The first of these two algorithms, which is described later, is called the direct enumeration algorithm, and accomplishes a mapping, called enumeration. The second algorithm, called the inverse enumeration algorithm, accomplishes the inverse mapping.

In operation, the present invention assumes that the symbols of words have an alphabetic ordering. The enumeration maps any word satisfying certain requirements (especially modulation constraints) to its lexicographic (alphabetic, dictionary) number in the set of all words satisfying those requirements. For two main versions of the invention, those requirements may be defined by all of the following: a) any fixed alphabet of G symbols (G=2 in modulation coding), b) any fixed length L of those words, c) any fixed state transition table with S states and transition symbols from that alphabet, d) any fixed initial state from those S states, and e) either the requirement that the final state coincide with the initial state or the requirement that all final states be permitted.

With these and other objects, advantages and features of the invention that may become hereinafter apparent, the nature of the invention may be more clearly understood by reference to the following detailed description of the invention, the appended claims and the several drawings attached herein.

BRIEF DESCRIPTION OF THE DRAWINGS

FIG. 1 is a state transition table for the states $s=0,1, ..., |S|-1$ for run-length-limiting (d, k) constraints assuming a state to be equal to the number of zeroes after the last "1" bit ($S=k+1$) and where $d=2$ and $k=5$;

FIG. 2 is a table showing maximum rate modulation code mapping for the state transition table of FIG. 1, in which the initial state is equal to the final state which is equal to 0, and for a codeword length $L=12$;

FIG. 4 a table showing an array of natural numbers of size $L \times |S|$, called an array of accumulated numbers, which may be stored in a ROM or other memory of the apparatus of the present invention and is used for the encoding and decoding of both the modulation coding and data compression functions of the present invention;

FIG. 5 is a table illustrating how, for the data shown in FIG. 2, lexicographic numbers of codewords are calculated and used for the enumeration algorithm (decoding for modulation coding and encoding for data compression) provided by the method and apparatus of the present invention;

FIG. 17 is a table showing the results of experiments conducted by the inventor on the calculation of a rate for using the method of the present invention for various values of the parameters d, k and L, as well as a comparison of those results with capacities for corresponding (d,k) constraints with rates of known (d,k) codes; and FIG. 18 is a table showing the corresponding optimal values of d for different k's for fixed distances between transitions of modified non-return-to-zero (NRZI) waveforms commonly used in connection with recording on magnetic tapes, magnetic or optical discs and in fiber communication channels.

DETAILED DESCRIPTION OF THE PREFERRED EMBODIMENT

Figure 3:
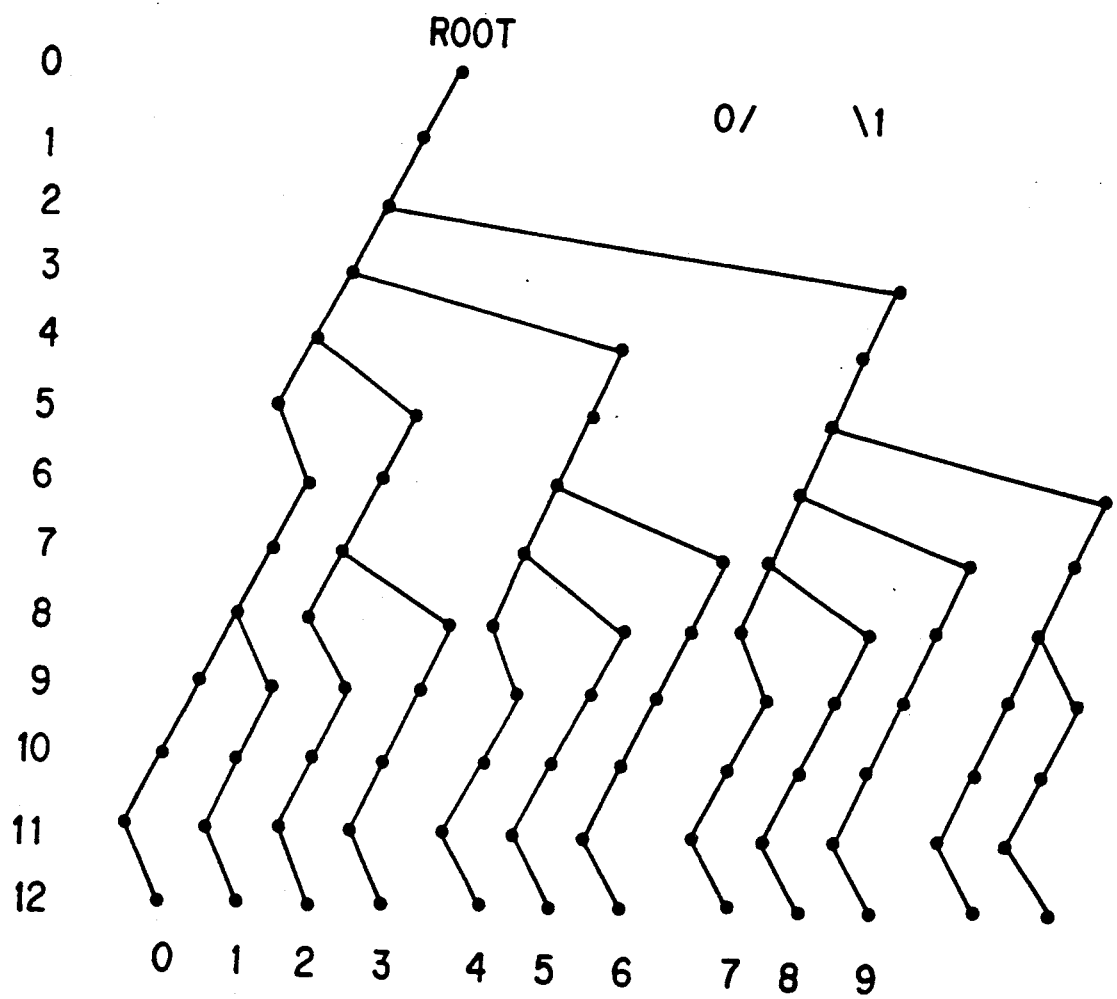
FIG. 3 is a tree in which any sequence of edges from the root to a terminal node represents one of the 12 words from column 2 of the table of FIG. 2, in which a left directed edge for any node indicates a "0" and a right directed edge indicates a "1"

We refer now in detail to the drawings wherein like parts are designated by like reference numerals throughout. Before explaining the mathematical basis of the present invention in more detail, it is believed advantageous to set forth a number of definitions and notations which will assist the understanding of the invention. During the course of this description, references will be made to many of the drawings attached herein.

Definition 1. An alphabet A is a finite fixed set of not less than two symbols with a given order, which is called alphabetic order. A word over an alphabet is a finite sequence of the symbols of that alphabet.

Notation 1. $|1|$ denotes the number of elements in a set (size) or in a sequence (length). Hence, for any word u over an alphabet, $0 \leq |u| < \infty$.

Notation 2. B denotes an arbitrary but fixed alphabet of symbols $0, 1, ..., B-1$, written in their alphabetical order and where $2 \leq |B| < \infty$.

Definition 2. A state transition table (STT) with transition symbols from the alphabet B and with a finite non-empty set S of states is a matrix with $|S|$ rows, designated by states from S, and with $|B|$ columns, designated by transition symbols from the alphabet B, and where the entries $z_{s,b}$ have as values either these states or a symbol (different from any state from S) indicating forbidden transitions. Each entry of the state transition table in any column b and in any row shows the state resulting from state s by the transition symbol b, as clarified by Definition 3. The state transition function of arguments s and b is defined as the function $e(s,b)$ having as values the corresponding entries.

Notation 3. Z denotes an arbitrary but fixed state transition table with states designated by $0,1, ...,s,..., |S|-1$; F is the symbol for a forbidden transition; and $z_{s,b}$ denote the entries of Z corresponding to state s and symbol b through the state transition function $e(s,b)$. FIG. 1 shows a state transition table Z in which $B=(0, 1)$, $|S|=6$, and F indicates a forbidden transition. This state transition table describes (2,5) runlength-limiting (d,k) constraints as set forth below.

Definition 3. The empty word (a word of length zero) is permitted by the state transition table Z for any initial state and with the final state equal to the initial state. A word u having the last symbol b is permitted for the state transition table Z for an initial state sin with a final state $s_{fin}$, if its prefix of length $|u|-1$ is permitted by the state transition table Z for the same initial state $s_{in}$, has final state s, and $e(s,b)=s_{fin}$.

Definition 4.

(a) The set of words of length L (over the alphabet B), defined by a state transition table Z and by the initial state $s_{in}$, is the set of words of length L over the alphabet B permitted by the state transition table Z for the initial state $s_{in}$ with arbitrary final states.

(b) The set of words of length L (over the alphabet B), defined by a state transition table Z and by the same initial and final state $s_{in}=s_{fin}$, is the set of words of length L over the alphabet B permitted by the state transition table Z for the initial state $s_{in}$ and with final state $s_{fin}=s_{in}$. The second column of FIG. 2 shows the set of words for this definition for the state transition table shown in FIG. 1, in which $s_{in}=s_{fin}=0$ and L=12.

Definition 5. If we let Q be any set of words over an alphabet, for example the alphabet B of Notation 2, then the enumeration of Q is a one-to-one mapping of Q to the set $\{0, 1, ..., Q-1\}$, such that each word is assigned its lexicographic (alphabet, dictionary) number in the set Q. For example, the third column of FIG. 2 shows the enumeration of the set of words of the second column of that figure.

Definition 6. If we let Q be a set of words of length L over the alphabet B as set forth in Definitions 4 (a) or (b) and we let Z be a state transition table with $|S|$ states and transition symbols from B, then, for the cases of Definitions 4 (a) and (b), respectively:

(a) An array C of sub-tree sizes for the state transition table Z for words of length L and for an initial state sin is an $L \times |S|$ matrix having entries $c_{l,s}$, where $0 \leq l \leq L-1$ and $0 \leq s \leq |S|-1$. These entries are numbers given by the formula $c_{l,s}=|\{u \Sigma Q$ such that w is a prefix of $u\}|$, where w is any word of length 1 permitted by the state transition table Z for the initial state $s_{in}$ with final state s and Q is the set of words of Definition 4 (a).

(b) An array C of sub-tree sizes for the state transition table Z for words of length L and the same initial and final state $s_{in}=s_{fin}$ is an $L \times |S|$ matrix having entries $c_{l,s}$, where $0 \leq l \leq L-1$, and $0 \leq s \leq S-1$. These entries are numbers given by the formula $c_{l,s}=|\{u \Sigma Q$ such that w is a prefix of $u\}|$, where w is any word of length 1 permitted by the state transition table Z for the initial state $s_{in}$ with final state s, and Q is the set of words of Definition 4 (b).

Definition 7. If we let Q be a set of words of length L over the alphabet B as set forth in Definition 4 (a) or (b) and we let Z be a state transition table with the set S of states and transition symbols from B, then, for the cases of Definitions 4 (a) and (b), respectively:

(a) An array A of accumulated numbers for the state transition table Z for words of length L and for initial state $s_{in}$ is an $L \times |S| \times (|B|-1)$ matrix with entries $a_{l,s,b}$, where $0 \leq l \leq L-1$, $0 \leq s \leq |S|-1$, $1 \leq b \leq |B|-1$, and where the entries are numbers given by the formula $$a_{l,s,b} = \sum_{b'=0}^{b-1} |\{u \in Q \text{ such that } w \text{ suffixed by the transition symbol } b' \text{ is a prefix of } u\}|,$$

where w is any word of length 1 permitted by the state transition table Z for an initial states $s_{in}$ with final state s, and Q is the set of words of Definition 4 (a). Using definition 6, this formula can be written as $$a_{l,s,b} = \sum_{b'=0}^{b-1} c_{l+1,e(s,b')}.$$

where $b=1, 2, ..., |B|-1$.

(b) An array of accumulated numbers A for the state transition table Z with words of length L and the same initial and final state $s_{in}=s_{fin}$ is an $L \times |S| \times (|B|-1)$ matrix with entries $a_{l,s,b}$, where $0 \leq l \leq L-1$, $0 \leq s \leq |S|-1$, $1 \leq b \leq |B|-1$, and where the entries are numbers given by the formula $$a_{l,s,b} = \sum_{b'=0}^{b-1} |\{u \in Q \text{ such that } w \text{ suffixed by the transition symbol } b' \text{ is a prefix of } u\}|,$$

where w is any word of length 1 permitted by the state transition table Z for the same initial and final state $s_{in}=s_{fin}$ of the word u and for the final state s of the prefix w, and Q is the set of words of Definition 4 (b). Using definition 6, this formula can be written as $$a_{l,s,b} = \sum_{b'=0}^{b-1} c_{l+1,e(s,b')}.$$

where $b=1, 2, ..., |B|-1$.

The application of Definition 7 is shown in the following example. FIG. 4 shows an array according to the Definition 7 (b) above for the state transition table shown in FIG. 1, in which L=12 and $s_{in}=s_{fin}=0$. Note that some entries that are not used by the enumeration algorithms are not shown. The array becomes of size $L \times |S|$ because $|B|-1$ is equal to 1. The entries in the array shown in FIG. 4 can be counted from the tree of FIG. 3, in which any sequence of edges from the root to a terminal node represents one of the 12 permitted words.

Notation 4. When L and $s_{in}$ are assumed as arbitrary but fixed values, then U denotes a set of words according to Definition 4 (a) above and W denotes a set of words according to Definition 4 (b) above. Assume $I=|U|$ and $J=|W|$.

Algorithm 1. The first or direct enumeration algorithm uses the array defined by the Definitions 7 (a) or 7 (b), respectively, in combination with the state transition table Z which defines the sets U or W, for the enumeration of the set U or W, respectively. Using Definition 5, the algorithm should assign to the word $u=(u1, u2, .., ul,..., uL)$, in U or W, respectively, its lexicographic number i in the set $\{0, 1, ..., I-1\}$ or $\{0, 1, ..., J-1\}$, respectively. Assume $a_{l,s,o}=0$ for all l and s such that $0 \leq l \leq L-1$ and $0 \leq s \leq S-1$. Denote by $s_l$, $0 \leq l \leq L$, the final state of the prefix of length l of the word u. Hence, $s_0=s_{in}$, $s_L=s_{fin}$, and $s_{l+1}=e(s_l,u_{l+1})$. Then, we find the lexicographic number i of the word u by the formula $$i = \sum_{l=0}^{L-1} a_{l,s_l,u_l+1} = \sum_{l=0}^{L-1} a_{l,e(s_l-1,u_l),u_l-1}.$$

Therefore, the number of operations and the required number of stored integers in the array are linear functions of the word length L.

The following example illustrates the operation of this direct enumeration algorithm. Referring to FIG. 5, there is shown an illustration of how the direct enumeration algorithm described above accomplishes the enumeration shown by columns 2 and 3 of FIG. 2. FIG. 5 was also constructed by using the array shown in FIG. 4 and described in Definition 7(b). For this example, $s_{in} = s_{fin} = 0$ and $L = 12$.

In short, the steps of the direct enumeration algorithm can be described as follows:

Step 0. $L \leftarrow 0$, $g \leftarrow 0$, $s \leftarrow s_{in}$ (in any order). Step 1, $1 \leq 1 \leq L$. If $u_{l+1} = 0$, $s \leftarrow e(s,b)$. If $u_{l+1} \neq 0$, $g \leftarrow g + a_{l,s,b}$, where $b = u_{l+1}$. Then update the state by $s \leftarrow e(s,b)$. If $l = L$, it is not necessary to modify s.

Step $L + 1$. The lexicographic number i is found as the output g.

Algorithm 2. The second algorithm used by the present invention is the inverse enumeration algorithm. This algorithm accomplishes mapping which is inverse to the enumeration mapping accomplished by the first algorithm (see Definition 5). The inverse mapping is the mapping of the set of numbers $0, 1, \ldots, J-1$ or $0, 1, \ldots, I1$ to the set U or W, respectively, using that state transition table Z that defines them together with the array described by Definition 7(a) or 7(b), respectively. Thus, for example, utilizing Definition 5 above, the inverse enumeration algorithm should assign to the number i the word u (having lexicographic number i) from U or W, respectively. This algorithm is based upon the Algorithm 1 set forth above. The number of operations and the required number of stored integers in this algorithm are also linear functions of L.

The following $L + 1$ steps $(0, 1, \ldots, 1, \ldots, L+1)$ are performed in order to produce the respective inverse mapping. The notation used here has the same meaning as in Algorithm 1. An additional value h is used in Algorithm 2, which is the hypothetical value of g for ul (the current symbol to be decoded) equal to some nonzero symbol. In step zero, the values of l, g and h are set equal to 0 and the value of s is set to $s_{in}$ (in any order). In the next L steps $(1, 2, \ldots, 1, \ldots, L)$ the procedure can be described as follows. At each step 1 find $$h = \max \{g_{l-1} + a_{l-1,s} - 1, b \leq i\} b \leq 1.$$

If this set $\{g_{l-1} + a_{l-1}s\Phi - 1, b \leq i\}$ is empty, then the output $u_l = 0$. Otherwise, maximum is reached for some b, the output $u_l = b$. In both cases, set $g_l = h$ (when $u_l = 0$, $g_l = g_{\Phi-1}$). Then set $s_1 = e(s_{l-1}, u_l)$. If $|B|$ is large, then $$h = \max \{g_{l-1} + a_{l-1,s}\Phi - 1, b \leq i\} b \leq 1$$

can be found dichotomically (also the differences i-g can be compared with the different values of $a_{l-1,s}\Phi - 1,b$. If $1 = L$, it is not necessary to modify s.

Algorithm 3. The third algorithm necessary for consideration is that for the construction of the array described by Definition 7(a) or 7(b) from the array described by Definitions 6(a) or 6(b), respectively. The corresponding number of operations to produce that array is a linear function of the word length L. The algorithm for producing that array is based upon the following formula:

$$a_{l,s,b} = \sum_{b'=0}^{b-1} c_{l-1,e(s,b')}.$$

where $b = 1, 2, \ldots, |B| - 1$. The entries $a_{l,s,b}$ for any l and s are calculated in order of increasing b.

Algorithm 4. The fourth algorithm is used to construct an array described by Definitions 6(a) or 6(b) from the state transition table described by Definition 2, an example of which is shown in FIG. 1. Again, the number of operations is a linear function of the word length L. The algorithm is based upon the following formula:

$$c_{l,s} = \sum_{b'=0}^{|B|-1} c_{l+1,e(s,b')}.$$

If $e(s,b) = F$, then we assume that $c_{l+1,e(s, b)} = 0$. The entries $c_{l,s}$ are calculated by rows in order of decreasing 1 from $l = L$. For the case of Definition 6(a) we assume that all entries $c_{L,s}$ are equal to 1. For the case of Definition 6(b) we assume that $c_{L,s} = 1$ if, and only if, $s = s_{fin} = s_{in}$. Otherwise, $c_{L,s} = 0$.

Algorithms 5 and 6. Algorithms 5 and 6 accomplish the decoding of $2^N$ binary codewords of length L to all $2^N$ binary source blocks of length N. This decoding is one-to-one mapping inverse to the encoding mapping accomplished by Algorithms 7 or 8, respectively. Both Algorithms 5 and 6 utilize the direct enumeration Algorithm 1 for two different sets of codewords, respectively. These sets of codewords are the first $2^N$ words of the set of words described by Definition 4(b) or 4(a), respectively. The set of $2^N$ codewords for Algorithm 5 is the same the in process of decoding a sequence of codewords and is defined by the same and fixed initial and final states cf codewords. Hence this coding is without error propogation, i.e., an error causing the wrong decoding of one codeword does not cause the wrong decoding of the next codeword.

The set of codewords for Algorithm 6 depends on the initial state of the codeword to be decoded, which state coincides with the final state of the previous codeword. Hence, the coding is with error propogation, but the rate is the absolutely minimum possible for fixed-to-fixed length codings for any given fixed length L of the codeword (or fixed length N of the source block) and for any constraints defined by a state transition table.

Using Algorithm 5 or 6, the decoding is the same but for different arrays of accumulated numbers (Definitions 7 (a) and 7 (b), respectively). For Algorithm 5 the array is used for a fixed initial state. For Algorithm 6 the initial state is changed in sequence with the codewords to be decoded. The decoding is accomplished as follows. First, the fixed length N of the block of data to be decoded is set as $N = \log_2 I$ or $N = \log_2 J$, respectively, where I and J are the number of words described by Definitions 4(b) or 4(a), respectively. For Algorithm 6 the number N is the minimum for all possible initial states. The integer I or J is found utilizing the direct enumeration Algorithm 1, using one of the two requirements just described, and is the lexicographic number +1 of the permitted word with the greatest lexicographic number, that is, the word for which all transitions correspond to the symbol with the maximum possible alphabetical number. To decode a word of length L, the direct enumeration Algorithm 1 is applied to this word with one of the two requirements discussed above. The source block, produced as a result of that decoding, is a binary representation of the lexicographic number obtained. The integers I and J can also, and more simply, be found as the entry $c_{in,0}$ of the array of subtree sizes (defined in Definition 6) used for construction of the corresponding array of accumulated numbers.

Algorithms 7 and 8 accomplish encoding corresponding to the decoding accomplished by Algorithms 5 and 6, respectively. Hence, they utilize the inverse enumeration Algorithm 2 for two different sets of codewords, respectively. The state transition table and array of accumulated numbers used for encoding are the same as for decoding.

Definition 8. The rate of coding for Algorithms 7 and 8 is defined as a value $r=N/L$. Shannon's capacity for the constraints described above for the fixed-to-fixed length coding, with or without error propagation, is $$C = \lim_{L \to \infty} \max r,$$

where the maximum is taken for all existing code mappings which satisfy the restrictions on the codewords described above. For both cases of fixed-to-fixed length coding, without and with error propagation, it follows from Definition 8 that both capacities C are equal. For both cases of Algorithms 5 and 6, as follows from Definition 5 of enumeration, the rate is maximum for any given L; thus, $$C = \lim_{L \to \infty} \max r.$$

Algorithms 9 and 10. Algorithms 9 and 10 accomplish the fixed-to-variable length encoding and decoding, respectively, for information source blocks of any given fixed length N. This encoding and decoding is as for Algorithms 6 and 8, respectively, with the following difference. For a given fixed length N of the source blocks and for any initial state s of the codewords, a minimum value L is found for which $\log_2 J_s \leq L$, where $J_s$ is J for the initial state s. The can be found by checking this inequality for the values $L = 1, 2, ...$ The coding provided by Algorithms 9 and 10 is with error propagation but the average rate is the absolutely minimum possible for fixed-to-variable length codings for any given fixed length N of source blocks, for constraints defined by any state transition table, and for the case of discrete memoryless binary sources with equal probabilities of symbols, i.e., sources with independent occurences of binary symbols with equal probabilities.

Definition 9. Let p(s) be probabilities of initial states of codewords in the case of Definition 8 $(0 \leq s \leq |S|-1, 0 \leq p(s) \leq 1,$ $$\sum_{s \in S} p(s) = 1).$$

p(s) 1).
Let the probabilities of codewords with the initial state be the same. This will be the case for discrete memoryless sources with equal probabilities of symbols, i.e., sources with independent occurrences of symbols with equal probabilities (that is, sources with equal probabilities of words of equal length).

For data from discrete memoryless sources with equal probabilities of symbols, the probabilities p(s), $0 \leq s \leq |S|-1$, could be found by solving a system of linear equations defined by the state transition table. The average length of codewords for coding Algorithm 9 is defined as follows $$L = \sum_{s=0}^{|S|-1} p(s) L_s$$

The average rate for this algorithm can be defined as the value $r = N/L$. Of course, for this rate the value $$C = \lim_{L \to \infty} \max r$$

will be equal to the capacity defined above for the constraints defined by the corresponding state transition table.

Algorithms 11-14. The remaining Algorithms 11-14 accomplish data compression without information loss (encoding Algorithms 11 and 13) and corresponding decompression without information loss (decoding Algorithms 12 and 14), respectively. In both cases the set of possible input source blocks is a set of words of fixed length N over an alphabet A, that is not necessarily binary. This set of words is defined by a state transition table and a common initial state for all possible input source blocks, which initial state is also found as the final state of the immediately previous input source block. This set of words is a set of words defined by Definition 4(a). Hence, these algorithms have error propagation, as is the usual case for data compression algorithms.

Encoding Algorithm 11, and the corresponding decoding Algorithm 12, provide fixed-to-fixed length data compression. Encoding Algorithm 13, and the corresponding decoding Algorithm 14, provide fixed-to-variable length data compression. Encoding Algorithms 11 and 13 and the corresponding decoding Algorithms 12 and 14 utilize the direct and inverse enumeration Algorithms 1 and 2, respectively. In both cases of encoding Algorithms 11 and 13, Algorithm 1 is applied to the set of possible input source blocks corresponding to the initial state defined as the final state of the immediately previous input source block. If the coding alphabet has q symbols (usually q=2), then the q-ary representation of the lexicographic number obtained by Algorithm 1 is the corresponding codeword. The only difference between the fixed-to-fixed encoding of Algorithm 11 and the fixed-to-variable encoding of Algorithm 13 is in the choice of length of this q-ary representation. The fixed length of codewords for Algorithm 11 is $$N = \max_{0 \leq s \leq |S|-1} N_s = \left\lceil \log_q \max_{0 \leq s \leq |S|-1} J_s \right\rceil,$$

where $N_s = \log_q J_s$ and where $J_s$ is the number of words in initial state s according to Definition 4(a). The variable length of codewords for Algorithm 13 is a fixed length for any given initial state s of the input source blocks and is equal to $N_s$, as just defined.

Algorithms 12 and 14, which accomplish decoding corresponding to the just described encoding Algorithms 11 and 13, respectively, use the inverse enumeration Algorithm 2 in a manner obvious to one skilled in the art and do not need special description.

Definition 10. The coding compression ratio of Algorithms 11 and 12 is equal to $CR = N/L$. For the fixed-to-variable length coding provided by encoding Algorithm 13 and decoding Algorithm 14, the value of N is the average length of the codewords.

For Algorithms 11 and 13, the compression ratio is obviously the minimum possible.

In order to estimate the rate of coding for both the modulation coding and the data compression algorithms described above, actual coding does not have to be performed for the case in which it can be assumed that all source blocks are equally probable. Such estimation can be done on the basis of the calculation of L, N, and different $N_s$, as those calculations were described above.

There will now be described in detail, in conjunction with the drawings, the method of implementing the present invention for the binary case, for both the decoding Algorithms 5 or 6 and the encoding Algorithms 7 or 8, respectively. These decoding algorithms incorporate Algorithm 1, which accomplishes enumeration. The encoding algorithms incorporate Algorithm 2, which accomplishes the mapping inverse to enumeration. While the method and apparatus of the present invention will not be explicitly described for the non-binary case, nor will methods of accomplishing all other algorithms for the binary and non-binary case, it is believed that all such algorithms can be produced and used by one having ordinary skill in the art based upon the following description and the description previously given of such algorithms.

The method of the invention for accomplishing fixed-to-fixed length encoding-decoding with the maximum possible rate for any given length of codeword, in which constraints on the codewords are defined by an arbitrary state transition table, with either an arbitrary but identical initial and final state (Algorithms 7 and 5, respectively) or arbitrary initial and final states of codewords (Algorithms 8 and 6, respectively), is as follows. As will be described in more detail below, the method of the present invention corresponds to the use of the decoding Algorithms 7 or 5, which incorporate Algorithm 1 for enumeration, and also of the encoding Algorithm 9, which itself incorporates Algorithm 2, for the mapping inverse to enumeration.

Figure 6A:
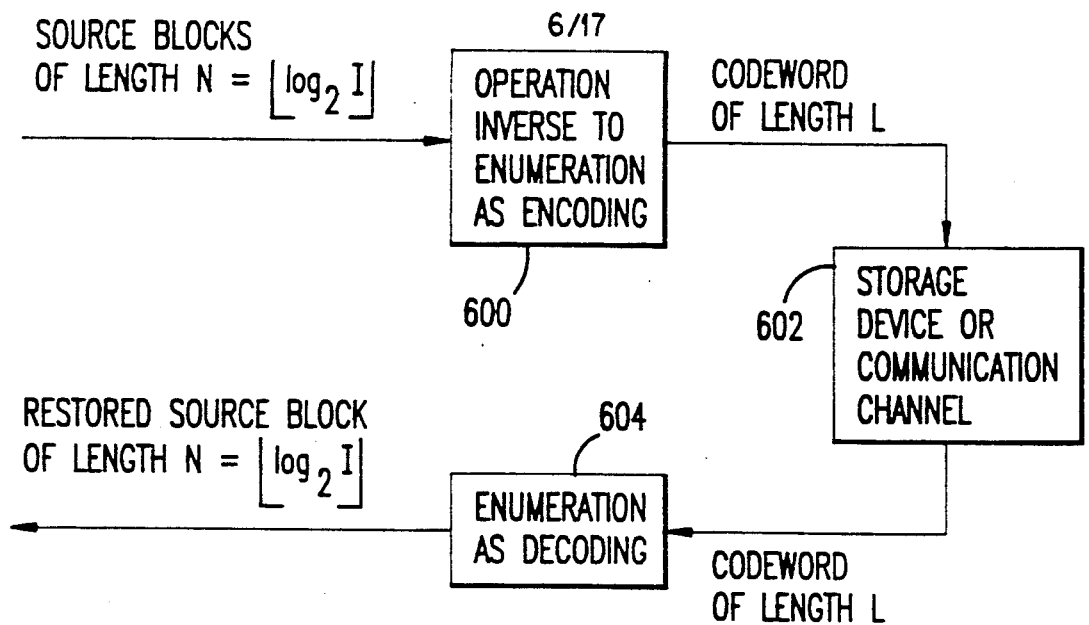
FIG. 6a is a brief flow chart showing how the method and apparatus of the present invention operate as an encoder and a decoder for use for modulation coding.

More specifically, the method of the present invention for the case of the decoding of a binary coding alphabet will now be described. This method utilizes the decoded Algorithm 5, which incorporates the enumeration Algorithm 1. The method is illustrated by the flow chart of FIG. 6a. As shown in that figure, source blocks of length N equal to $\log_2 I$ are encoded as step 600 using the previously described enumeration Algorithm 1. That produces codewords of length L. The codewords are then applied to a storage device or communication channel at step 602 (which storage device or communication channel are not a part of the present invention). In order to decode the codewords of length L, they are decoded by use of the mapping inverse to enumeration accomplished by inverse enumeration Algorithm 2 at step 604, which produces the restored source block of length $N = \log_2 I$.

Figure 6B:
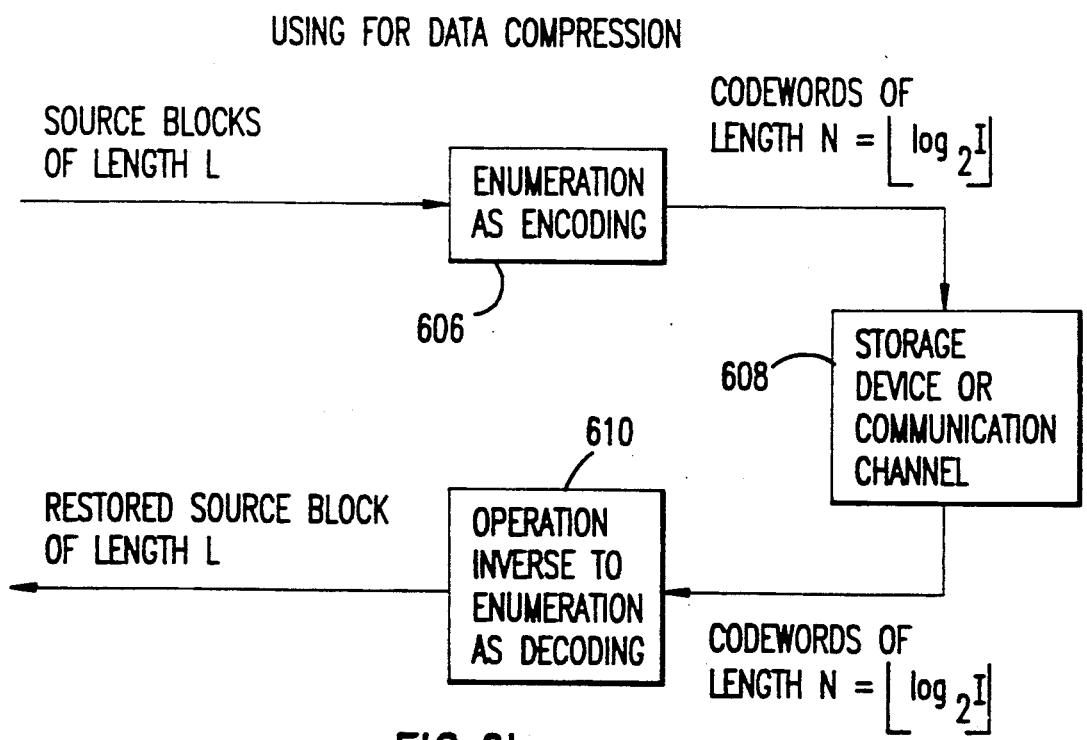
FIG. 6b shows a brief flow chart showing how the method and apparatus of the present invention can be utilized for data compression.

FIG. 6b shows the method of the present invention for use in data compression. In this case, source blocks of length L are encoded at step 606 by the use of the enumeration Algorithm 1 disclosed herein, thus producing codewords of length $N = \log_2 J$. The codewords may then be fed at step 608 to a storage device or communication channel (which storage device or communication channel are not a part of the present invention). When necessary, the codewords of length $N = \log_2 J$ may be decompressed at step 610 by the application of inverse mapping to enumeration in accordance with Algorithm 2, which accomplishes the decoding. The result is the restored source blocks of length L.

The method for decoding encoded data, which implements the algorithms previously described, is illustrated by the flow charts of FIGS. 7-10. This method of decoding transforms binary words or codewords of length L to binary words of a fixed (for that L) length N, which is not given. The input codewords should satisfy the constraints which have previously been described in connection with Definitions 3 and 4. If a codeword does not satisfy the constraints, then an error signal may be produced.

As described, the constraints on the codewords are defined by the incorporation of the state transition table in the method of performing the invention. For the example of the state transition table shown in FIG. 1, the constraints that the initial state $s = 0$ is the same as the final state and that the length of the codewords L is equal to 12 are illustrated by FIG. 2.

The array of accumulated numbers corresponding to the state transition table of FIG. 1 is shown in FIG. 4. That array of accumulated numbers was described previously. If the codeword 000100100001 is processed by the method and apparatus of the present invention, using the state transition table of FIG. 1 and the array of FIG. 4, then the result of the processing or decoding will be the word 110, as shown in the first column of FIG. 2. As previously described, FIG. 2 shows, in the middle or second column, all those words satisfying the constraints of the state transition table of FIG. 1. Only for those words can the decoding of the present invention be applied.

Before the method and apparatus of the invention are utilized, the length N of recovered information source blocks for a given length L of codewords must be found. As previously described, the fixed length N of blocks of data to be encoded is defined as $N = \log_2 I$. In addition, utilizing Algorithms 4 and 3, an array of accumulated numbers corresponding to Algorithms 5 and 6, respectively, is constructed from the desired state transition table, given the same initial and final state for Algorithm 5 or for all initial and final states for Algorithm 6.

The desired state transition table and the array of accumulated numbers are stored in a ROM or other memory.

Figure 7:
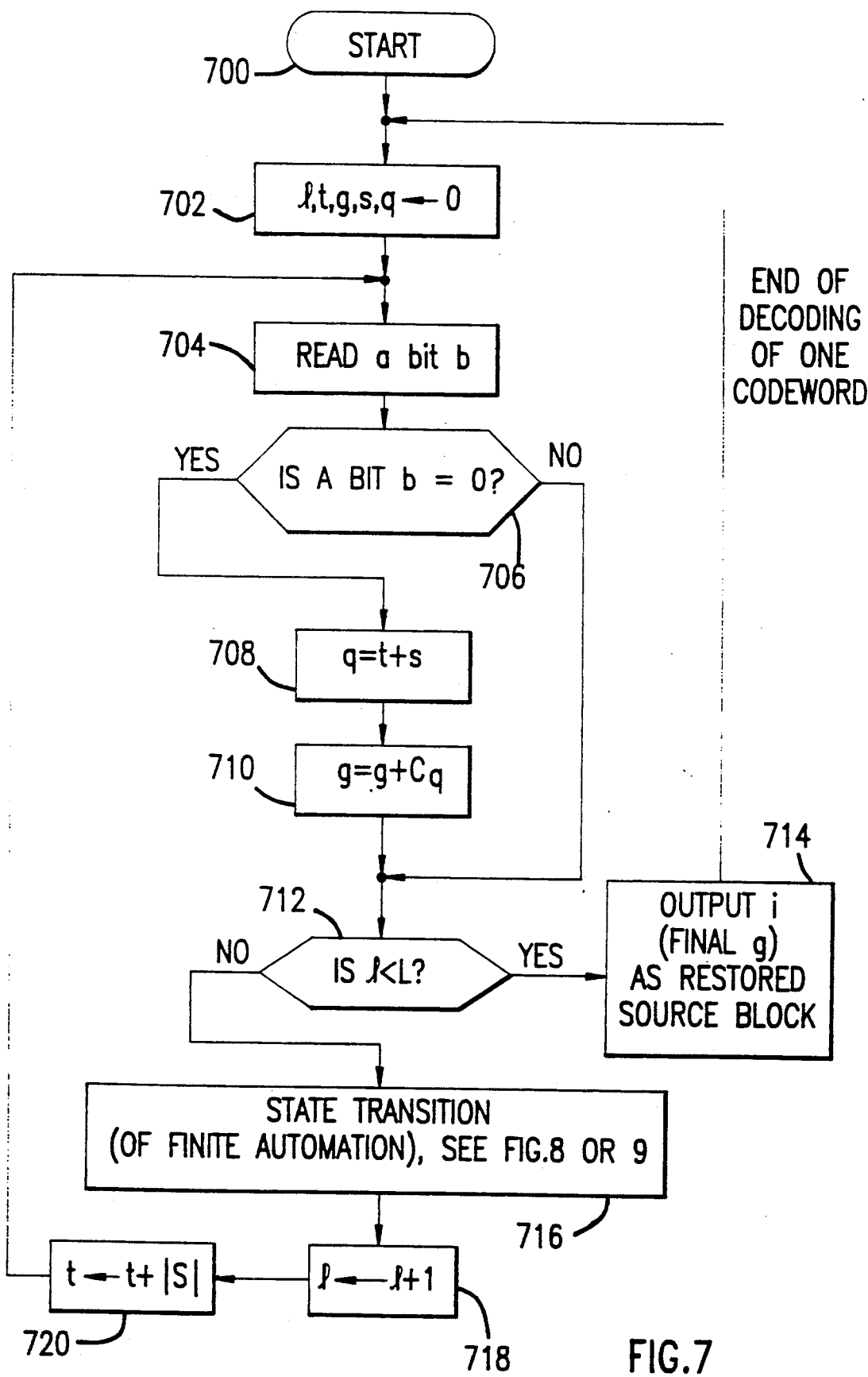
FIG. 7 shows a flow chart of the method of the present invention when used for decoding corresponding to fixed-to-fixed length modulation coding in which the initial state is equal to the final state, which is equal to zero, and with state transition of finite automation as shown in FIGS. 8 or 9.

Initially, at the start of step 702 of the method, an initial value is assigned to the state s (in FIG. 7 the value is 0). For Algorithm 5, this initial value will be the same as that for the given initial-final state. For Algorithm 6, the initial state value of the state s can be any state used for the construction of the array, but the same state as that used for encoding. None of the other steps of the method of accomplishing the invention depend upon which of the Algorithms 5 or 6 is being executed. The main difference between the two Algorithms, 5 and 6, is which of the two arrays described by Definitions 7 (a) and 7 (b), respectively, is utilized by the method of the invention.

At step 702, a 0 is assigned as the value of 1, which denotes the number of bits of the processed codewords, of bits that have already been processed. On the same step, a 0 is assigned as the value of t, which denotes the address $1 \times |S|$ of the beginning of the 1th row of the array of accumulated numbers. Thus, the current address $1 \times |S|$ of the beginning of the 1th row of the array of the accumulated numbers is 0. That current address indicates in which row the next accumulated number will be added to the value g. On the same step 702, a 0 is assigned as the value of g, which denotes the already accumulated part of the sum of numbers from the array of accumulated numbers for calculating the lexicographic number of the processed codeword in the set of all words satisfying the constraints given by the state transition table. The sum i of the numbers from the array of accumulated numbers is the lexicographic number of the processed codeword.

Finally, on the same step 702, a 0 is assigned as the value of q, which denotes the address of an entry in the array of accumulated numbers, which entry is used for the formation of the sum i. As previously described, t denotes the address $1 \times |S|$ of the beginning of the row of the entry used for the formation of the sum i in the array of accumulated numbers. The actual entry itself is denoted by C(q).

After the initial values of the variables 1, t, g, s and q are set to 0, a bit b of the codeword to be decoded is read at step 704. At step 706, a determination is made as to whether that bit b is a 0. If it is determined in step 706 that the bit b is not equal to 0, then the program jumps to step 712 to determine whether 1 is less than L, that is, whether this is the last bit b of the word to be processed. If it is determined at step 712 that the last bit b has been processed, then the lexicographic number i of the processed codeword is output as the restored source block of data and the program jumps back to step 702. If it is determined at step 706 that the bit b read is not equal to 0, that is, that it is equal to 1, then the program goes to step 708 where the value of q is set to equal $t + |S|$. At step 710, the value of g is set to equal $g + C(q)$. Steps 708 and 710 serve to calculate an address q of an entry in the array of accumulated numbers as the address $t = 1 \times |S|$ of the beginning of the current row in the array of accumulated numbers, plus the current value of the state having a prefix of length 1 of the processed codeword having as the final state the state s.

The program then determines, at step 712, whether the current bit is the last bit of the word to be processed. If the current bit b being processed is not the last bit b of the word, then a determination is made of the final state of the word being processed. That word consists of the bits that have already been processed together with the bit b currently being processed. That state is found as an entry in the state transition table. That entry corresponds to the final state of the word consisting of the bits already processed and the bit b currently being processed. Step 716 is set forth in detail in the flow charts of FIGS. 8 and 9.

The program then moves to step 718 where the value of 1 is incremented by 1. After the position 1 of the currently processed bit b is incremented by 1, the value of the address $t = 1 \times |S|$ of the beginning of the row of the array of accumulated numbers (where $|S|$ is the number of states of the state transition table) is increased by the number of states $|S|$ of the state transition table and then the next bit b of the codeword to be decoded is read.

After the final bit of a codeword to be decoded has been read, the binary representation of the lexicographic number i, which corresponds to the final sum g, is output. That binary representation is the lexicographic number of the processed codeword in the set of all words satisfying the given constraints as a result of the decoding of the present invention.

Figure 8:
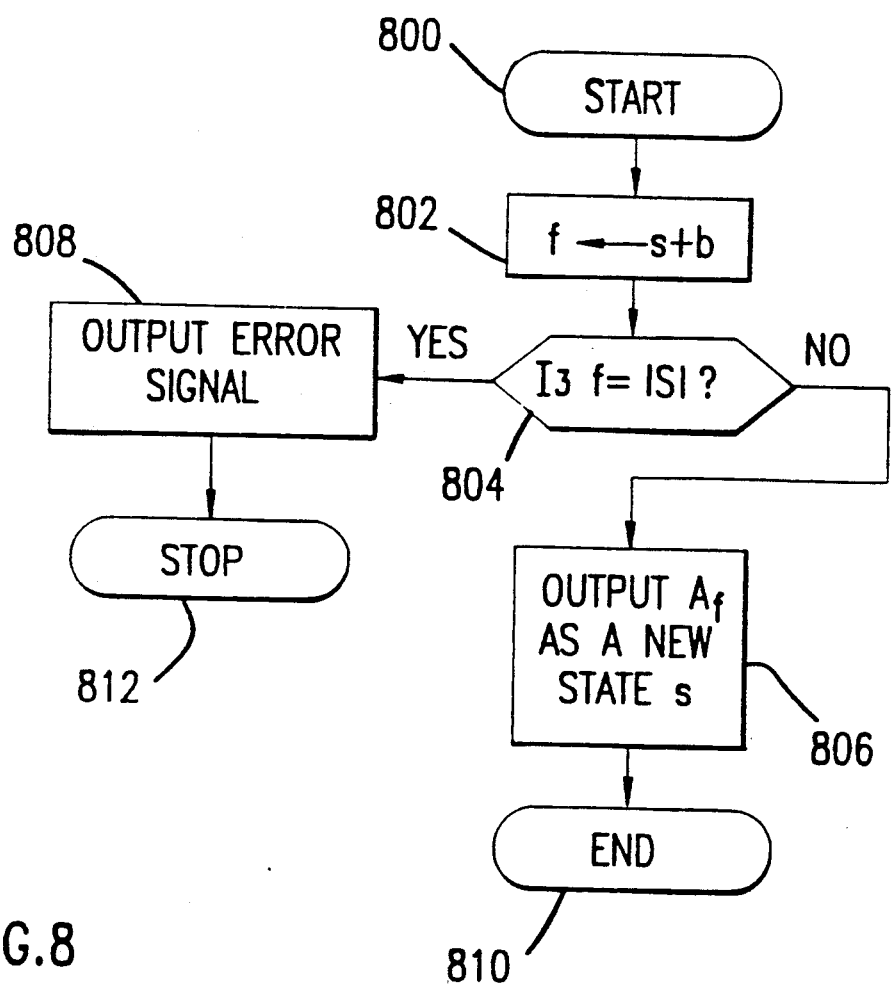
FIG. 8 shows a flow chart of state transition of the finite automation of FIG. 7 for the general case of an arbitrary state transition table stored in a ROM or other memory.

Step 716 of FIG. 7 is shown in detail by the flow chart of FIG. 8 for the general case of constraints defined by a state transition table. After starting 800, at step 802, an address of an entry in the state transition table is found. That entry corresponds to the current state s and the current bit b. The program then moves to step 804, where a determination is made as to whether the current entry is a forbidden transition. If it is determined that the current entry is a forbidden transition, then an error signal is output at step 808 and the program stops at step 812.

If it is determined at step 804 that the entry of the state transition table is not the symbol indicating a forbidden transition, then that entry is output as a new state s at step 806 and this portion of the software ends at step 810.

It should be noted that the method described above and shown in flow chart form in FIG. 8 produces an output error signal only if the processed word does not satisfy the constraints defined by the state transition table.

Figure 9:
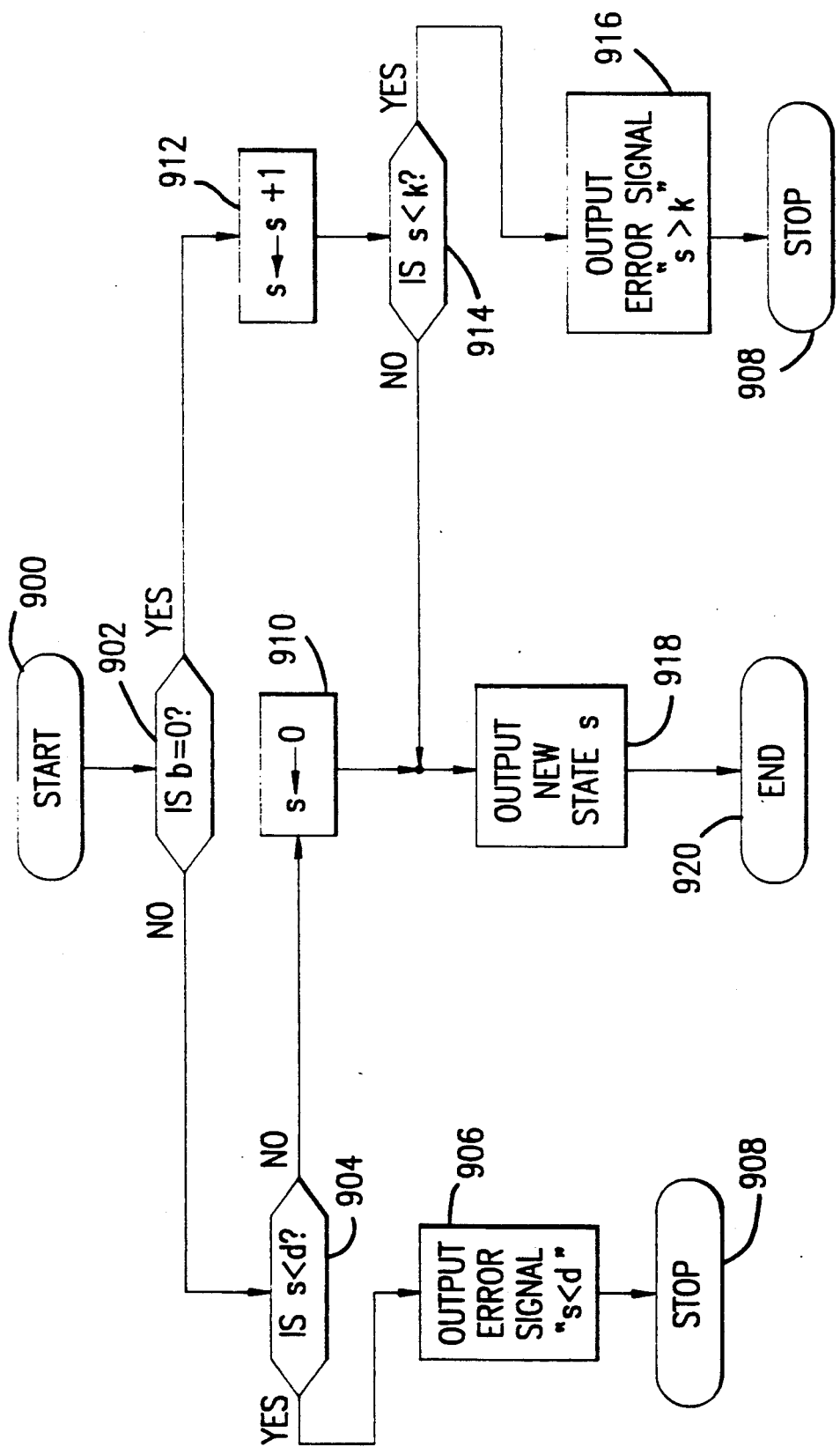
FIG. 9 shows a flow chart of state transition of the finite automation of FIG. 7 for the specific case of run-length-limiting (d,k) constraints.

Referring now to FIG. 9, there is shown in detail, in flow chart form, the step 716 of FIG. 7, for the case of arbitrary run-length-limiting (d,k) constraints onto possible codewords. For that specific case, it is not necessary to utilize a memory for storing the state transition table since, in this specific case, it is assumed that the final state of the binary word of length 1 is the number of 0's at the end of the word. It is also assumed that the initial and final states of any codeword are equal to 0. Hence, any codeword terminates as a minimum by one 1 and starts as a minimum from d zeroes.

The operation of the flow chart of FIG. 9 will now be described. After starting at step 900, a determination is made as to whether the current bit b being processed is a 0. If it is determined that the current bit b being processed is not a 0, then a determination is made as to whether the current state s is less than d, at step 904. In effect, a determination is made as to whether a number of terminating zeroes that appear in the codeword before the processed bit is less than the value of d. If the result of the determination of step 904 is that s is less than d, then an error signal "s less than d" is output at step 906 and the program stops at step 908. If it is determined at step 904 that the value of the state s is not less than d, then the value 0 is assigned to d at step 910.

If the determination at step 902 is that the value of the bit b being processed is a 1, then the number s, which represents the number of terminal zeroes, is increased by 1 at step 912. The determination is then made, at step 914, of whether the value of s is greater than k. If s is greater than k at step 914, then an error signal "s is greater than k" is output at step 916 and the program stops at 908.

If it is determined at step 914 that the value of s is not greater than k, then the current (and incremented) value of s is output as the new state s at step 918 and the program ends at step 920.

Figure 10:
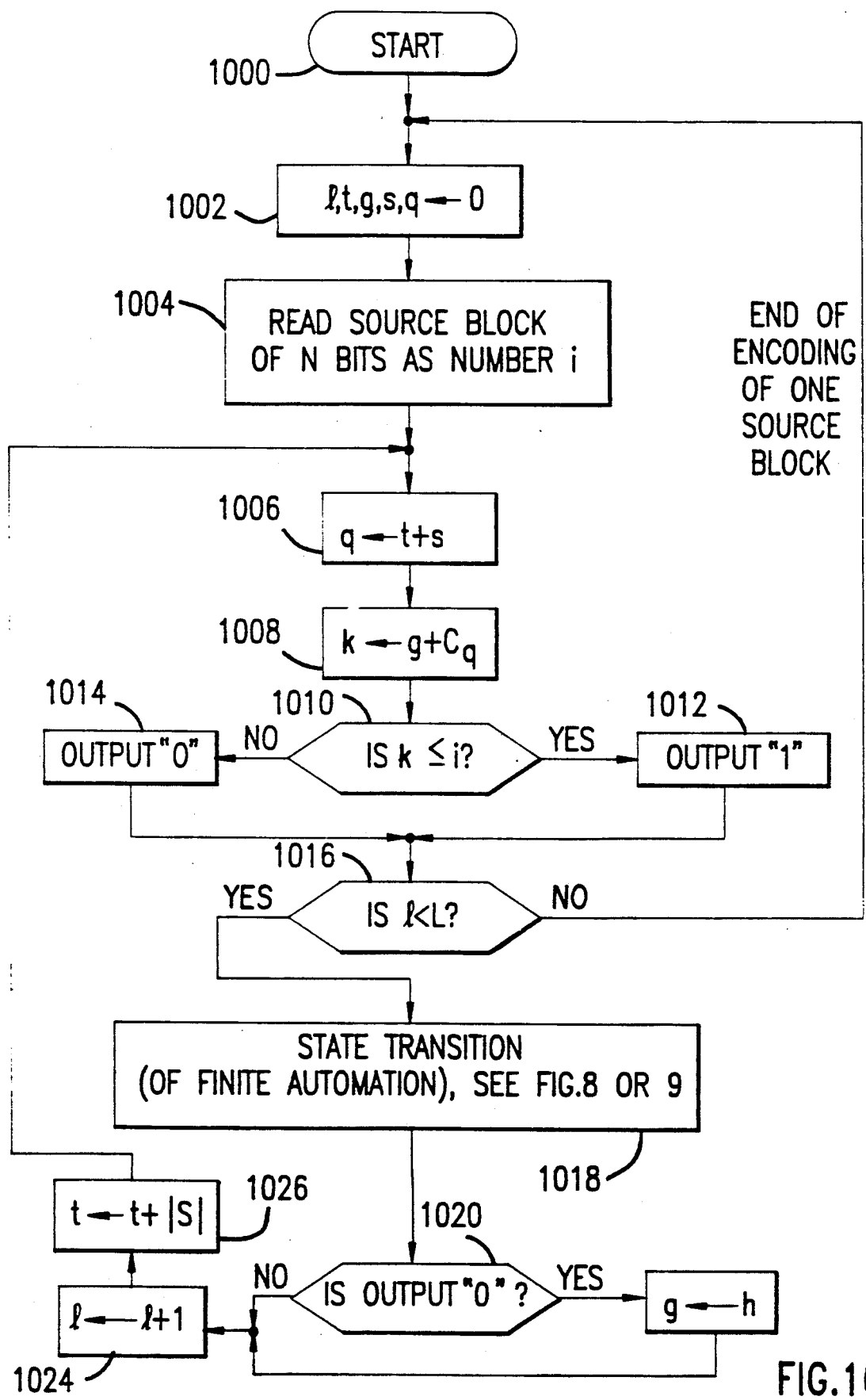
FIG. 10 shows a flow chart of encoding corresponding to the decoding of FIG. 7 with state transition of finite automation as shown in FIGS. 8 or 9.

FIG. 10 shows the method which implements Algorithms 7 and 8 for encoding for the case of binary coding alphabet. The method of encoding transforms binary words (input source blocks) of length N to binary words (codewords) of fixed (for this N) length L, where the length N is not given. Such output codewords should satisfy the constraints described by Definitions 3 and 4. If a codeword does not satisfy those restrictions, then an error signal is produced in the process of decoding.

In performing the method of encoding shown in flow chart form in FIG. 10 for the case in which the constraints on the codewords are defined by and incorporated in the state transition table of FIG. 1 by an initial state s=0, which is the same as the final state, and by a length of codewords L=12, the array of FIG. 4 will be incorporated in the method shown in FIG. 10 as the array of accumulated numbers. That is the same state transition table and the same array of accumulated numbers that were used for decoding. For example, if the input word 110 were to be processed by the method shown in FIG. 10, which incorporates the state transition table of FIG. 1 and the array of FIG. 4, then the result of the processing or encoding will be the word 000100100001, as it is illustrated in FIG. 2. FIG. 2 shows the mapping accomplished by the method of the present invention. As seen from FIG. 2, in the first column, those words satisfying the constraints of the state transition table of FIG. 1 are shown. Only words satisfying such constraints can be the result of encoding.

As will be obvious to those of ordinary skill in the art, the methods embodied in the flow charts of FIGS. 7–10 may utilize any devices of computing that can accomplish the steps comprised by the methods. As was the case for the method of decoding shown in FIG. 7, the method of encoding shown in FIG. 10 incorporates the state transition flow charts of FIGS. 8 or 9, as appropriate.

The encoding method of FIG. 10, as did the decoding method of FIG. 7, incorporates an array of accumulated numbers corresponding to the Algorithms 7 or 8, respectively, from: a) the desired state transition table; b) the given initial and final state for Algorithm 5 or for all initial and final states (for Algorithm 6); and c) the length L of the output and length N of information source blocks. The state transition table and the array of accumulated numbers may be stored in a ROM or other memory, as previously described. How the array of accumulated numbers is produced from the state transition table has previously been described by reference to Algorithms 3 and 4. The choice of the length N of input words or of recovered information source blocks for a given length L of codewords has also previously been described.

The method of encoding starts at step 1000. A value is assigned to the state s, as an initial state. For Algorithm 7, that initial value will be the same given initial-final state value used for the construction of the array of accumulated numbers. For Algorithm 8, the initial value of the state s can be any state independent of the construction of the array, but it must be the same as that used for the decoding process. For all other steps of the method illustrated in FIG. 10, it does not matter which of the Algorithms 7 or 8 is being processed. The main difference between the two Algorithms, 7 and 8, is which of the two arrays described by Definitions 7 (a) and 7 (b), respectively, is utilized.

At step 1002, a 0 is assigned as the value 1 of the bits of the codeword already produced, as the value t, which is the current address $1 \times |S|$ of the beginning of the 1th row of the array of accumulated numbers, in which row the next accumulated number can be added to a value g. A 0 is also assigned as the value g.

At step 1004, an input source block of data of length N is read. The integer for which this word is a binary representation is given by the number i, which is a lexicographic number of the codeword to be found in the set of all words satisfying the constraints on the codeword.

The subroutine then calculates the address of an entry in the array of accumulated numbers as the address t $= 1 \times |S|$ of the beginning of the current row in the array of accumulated numbers plus the current value of the state s whose prefix of length 1 of the processed codeword has s as its final state.

At step 1008, the entry $C_q$ of the array of accumulated numbers having the address q is added to the value g to produce a value h that will be used for comparison purposes. A determination is then made as to whether the number h is less than or equal to the number i which is the binary representation of the input word being coded. That occurs at step 1010. If the determination at step 1010 is that the value of h is less than or equal to i, then a 1 is output and used at decision step 1016.

If it is determined that h is greater than i at step 1010, then a 0 is output at step 1014 and that value is used at decision step 1016. A determination that h is less than or equal to i indicates that a 1 is the found bit of the codeword being encoded. If the value of h is greater than i at step 1010, then a 0 is output as the found bit of the codeword to be encoded.

A determination is then made at step 1016 as to whether the bit being considered is the last bit b of the codeword to be encoded. That determination is made by testing whether 1 is less than L. If it is determined that the current bit is not the last bit of the codeword to be encoded, then the program jumps back to step 1002 and then repeats the steps described above. If it is determined that the last bit of the codeword is the current bit being processed, then the program goes to the state transition step 1018.

Step 1018 serves to find the final state of the word consisting of the bits of the codeword already produced. That state is found as an entry of the state transition table. That entry corresponds to the final state of the word consisting of the bits of the codeword already found, without the current bit being processed, and the last 1 bit, that is, that bit currently being processed, is added to that. The step 1018 is detailed in the flow chart of FIG. 8 for the general case and in the flow chart of FIG. 9 for the case of arbitrary run-length limiting constraints on codewords. Those two flow charts have previously been described in connection with the decoding method shown in FIG. 7, thus will not be described again. The flow charts of FIGS. 8 and 9 are used in common for both encoding and decoding.

After step 1018 has been performed, a determination is made at step 1020 as to whether the currently found bit of the codeword is a 0. If the last currently found bit of the codeword is a 0, then the value h is assigned to the variable g, at step 1022. If the value of the last current found bit of the codeword is a 1, then the value of 1 is incremented by 1 at step 1024 and the value of the address t at the beginning of a row of the array of accumulated numbers is incremented by the number of states $|S|$, at step 1026, and the program then jumps to step 1006 and continues.

Figure 14:
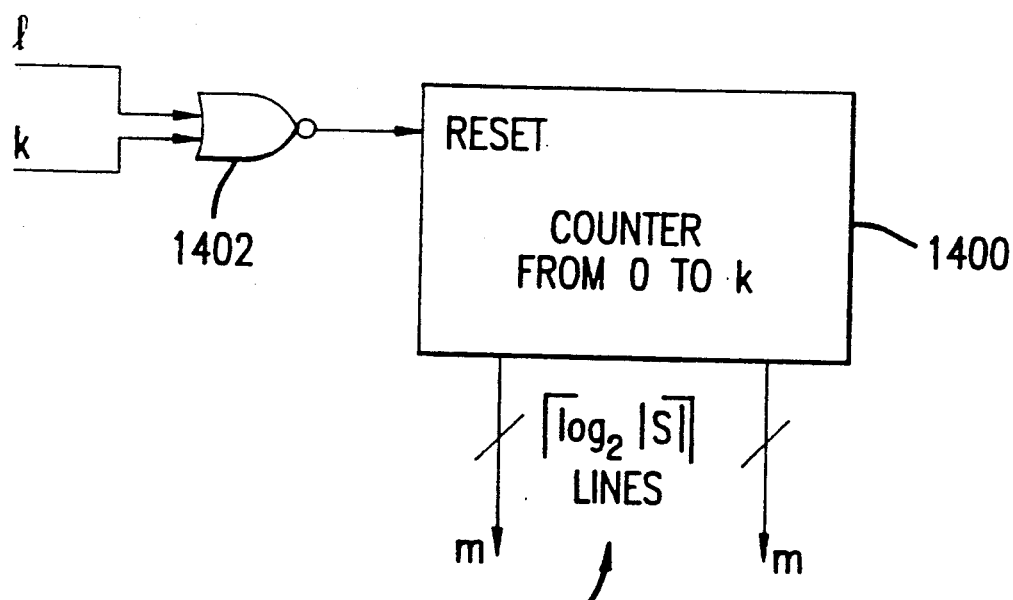
FIG. 14 shows a block diagram of the finite automation of FIG. 12 for the specific case of run-length-limiting (d,k) constraints.
Figure 15:
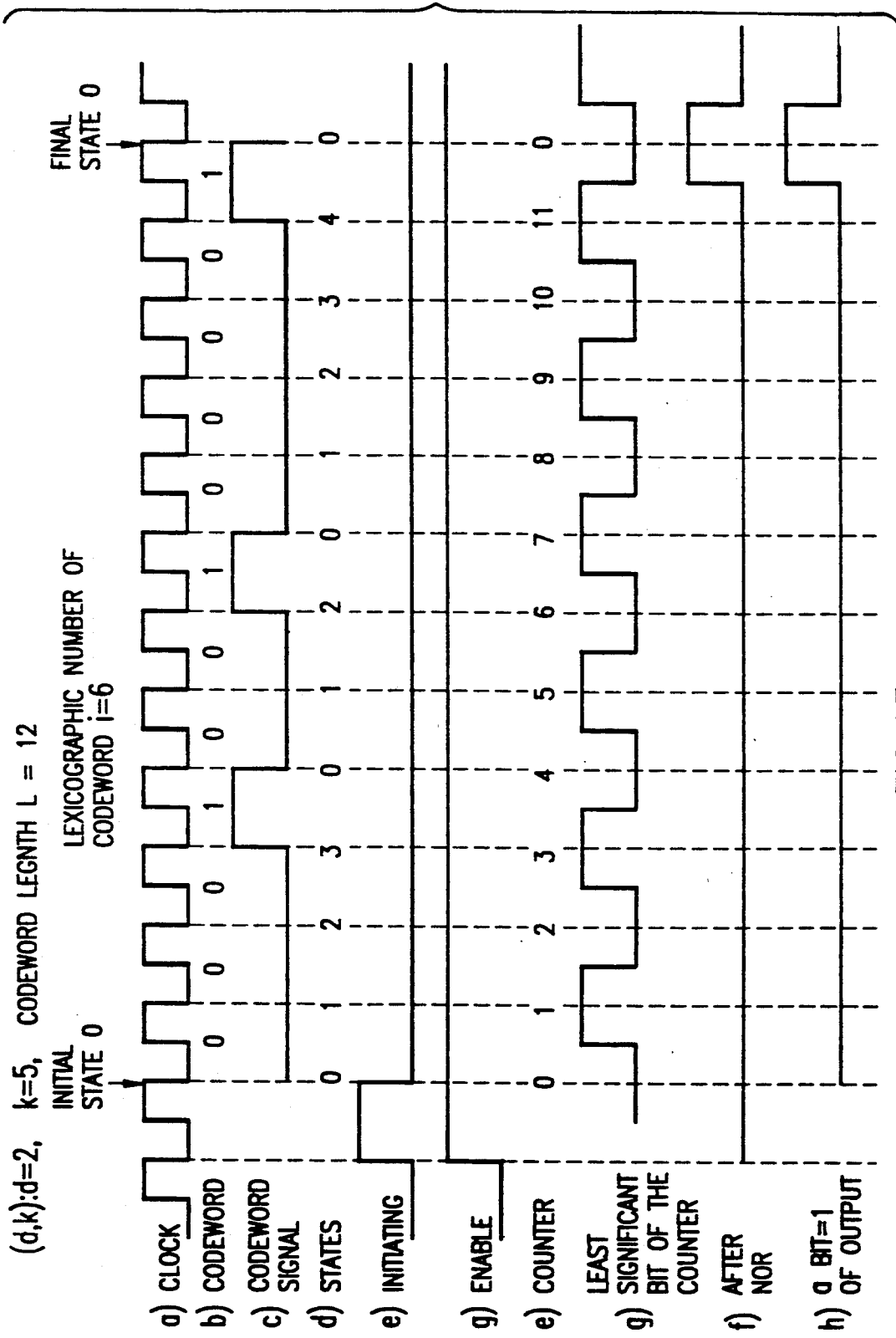
FIGS. 15a–h show time diagrams for the clock, codeword, codeword signal, state, initiating, enable, counter; least significant counterbit, signal after NOR and output waveforms used with and produced by the circuitry of FIG. 11.

The apparatus for practicing the present invention is shown in FIGS. 11–14 and 16. FIG. 15 shows a timing diagram for the signals utilized in those figures. The apparatus disclosed may be utilized for the application of the present invention to a binary case; however, although not disclosed, an apparatus for use with a general case of the invention (i.e., non-binary) can be produced and used by a person having ordinary skill in the art based upon the disclosure herein.

The apparatus disclosed in the figures applies, for a binary case, the decoding Algorithms 5 or 6 and encoding Algorithms 7 or 8, respectively. The apparatus disclosed accomplishes a fixed-to-fixed length encoding-decoding, with the maximum possible rate for any given length of codewords, including constraints on codewords defined by an arbitrary state transition table and an arbitrary but identical initial and final state or arbitrary initial and final states of codewords. The apparatus effectuates the decoding Algorithms 5 or 6, which incorporate Algorithm 1 for accomplishing the enumeration. The apparatus also incorporates the encoding Algorithms 9 or 10, which incorporate Algorithm 2 for realizing the mapping inverse to the enumeration. The specific circuitry shown in the figures is directed to the case of a binary encoding alphabet.

As discussed in connection with FIGS. 7-10, certain precalculated information is necessary. For example, a precalculated state transition table and the array of accumulated numbers are stored in ROM or other memory and are thus available for use by the circuitry of the present invention. The state transition table was previously described in Definition 2 and the array of accumulated numbers was previously described in Definition 6. Definitions 3 and 4 described the set of words permitted by the constraints of the state transition table. The generation of the array of accumulated numbers from the state transition table was previously described by Algorithms 3 and 4. It is also necessary to choose the length N of the output word or the recovered information source block for a given length L of codewords. How that is accomplished has also previously been described.

The apparatus of FIGS. 11-14 effectuates the Algorithms 5 or 6, which incorporate Algorithm 1, the enumeration algorithm. Thus, the apparatus shown in FIGS. 11-14 is a decoder which transforms binary words (codewords) of length L into binary words of a fixed (for this L) length N, which is not given. Such input codewords should satisfy the constraints of the state transition table, which constraints have been previously described by Definitions 3 and 4.

As was the case with the discussion of the implementation of the method aspects of the present invention in connection with FIGS. 7-10, the constraints on the codewords are defined by the incorporation in the apparatus of the present invention, in a ROM or other memory, of a state transition table, which may be the state transition table of FIG. 1. That state transition table has an initial state s which, for example, is equal to 0 and which is also equal to the final state, and a length of codewords L=12. Using the state transition table of FIG. 1, the array of FIG. 4 is generated, which is incorporated in the apparatus of the present invention as an array of accumulated numbers and has a linear complexity of construction. The example given with respect to the codeword 000100100001 (described by reference to the STT of FIG. 1, the array of FIG. 4, and the result of its processing or decoding being a word 110 as illustrated by FIG. 2) is equally appropriate to the discussion of the apparatus shown in FIGS. 11-14.

Prior to describing the apparatus of FIGS. 11-16, it is believed advantageous to discuss the notation used in such diagrams and to provide their description. Such notation is equally appropriate to the notation (i.e., variables) utilized in FIGS. 7-10, namely the figures giving a specific example of the application of the method aspects of the present invention.

1. s, which is greater than 0 and less than $|S|-1$, denotes a state from $|S|$ states of the state transition table used, which state transition table is stored in a ROM or other memory.

2. $s_{in}$ denotes the initial state of the codeword. In the case of Algorithm 5, but not for Algorithm 7, the initial state is fixed and is the same as the final state of any codeword.

3. l denotes the number of processed bits which have already been processed from a codeword.

4. t denotes an address $1 \times |S|$ of the beginning of the lth row of the array of accumulated numbers.

5. g denotes the accumulated lth bit part of the sum of numbers from the array of accumulated numbers, which sum i is the lexicographic number of the processed codeword in the set of all words satisfying the given constraints.

6. b denotes the processed bit.

7. q denotes the address of an entry (the entry used for formation of the sum i) in the array of accumulated number.

8. t denotes the address $1 \times |S|$ of the beginning of the row of the entry at the address q.

9. $C_q$ denotes the entry at the address q.

10. L denotes the given length of each codeword.

11. $|S|$ denotes the number of states of the state transition table.

12. i denotes the lexicographic number of the processed codeword in the set of all words satisfying the given constraints.

Figure 11:
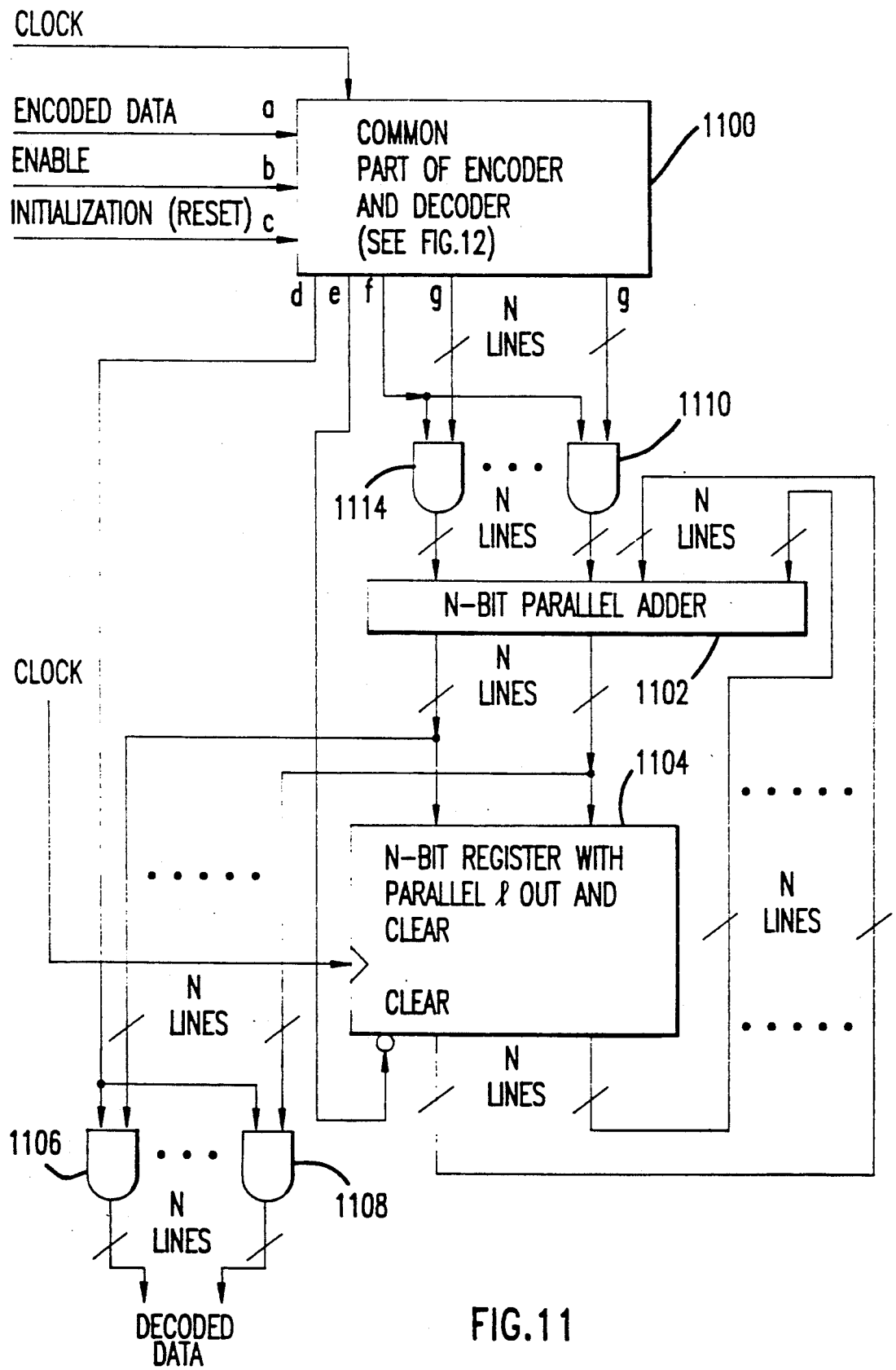
FIG. 11 shows a block diagram of the apparatus of the present invention for use in the decoding corresponding to fixed-to-fixed length modulation coding in which the initial state is equal to the final state and is equal to zero.

Referring now in detail to FIGS. 11-14, there is shown in FIG. 11 an element 1100 which is labelled as the common part of the encoder and the decoder. That element 1100 is used by both the encoding and decoding apparatus and is shown in detail in FIG. 12. The element 1100 has three inputs, namely, the encoded data, an enable line and an initialization or reset line. In addition, it is provided with a clocking input. Such signals appear on the inputs a, b and c and clock input of element 1100 of FIG. 11, and have their normally understood meanings.

FIG. 15 shows a timing which shows the interrelationship between the clock, signal enable and signal initialization signals, as well as other signals.

Figure 12:
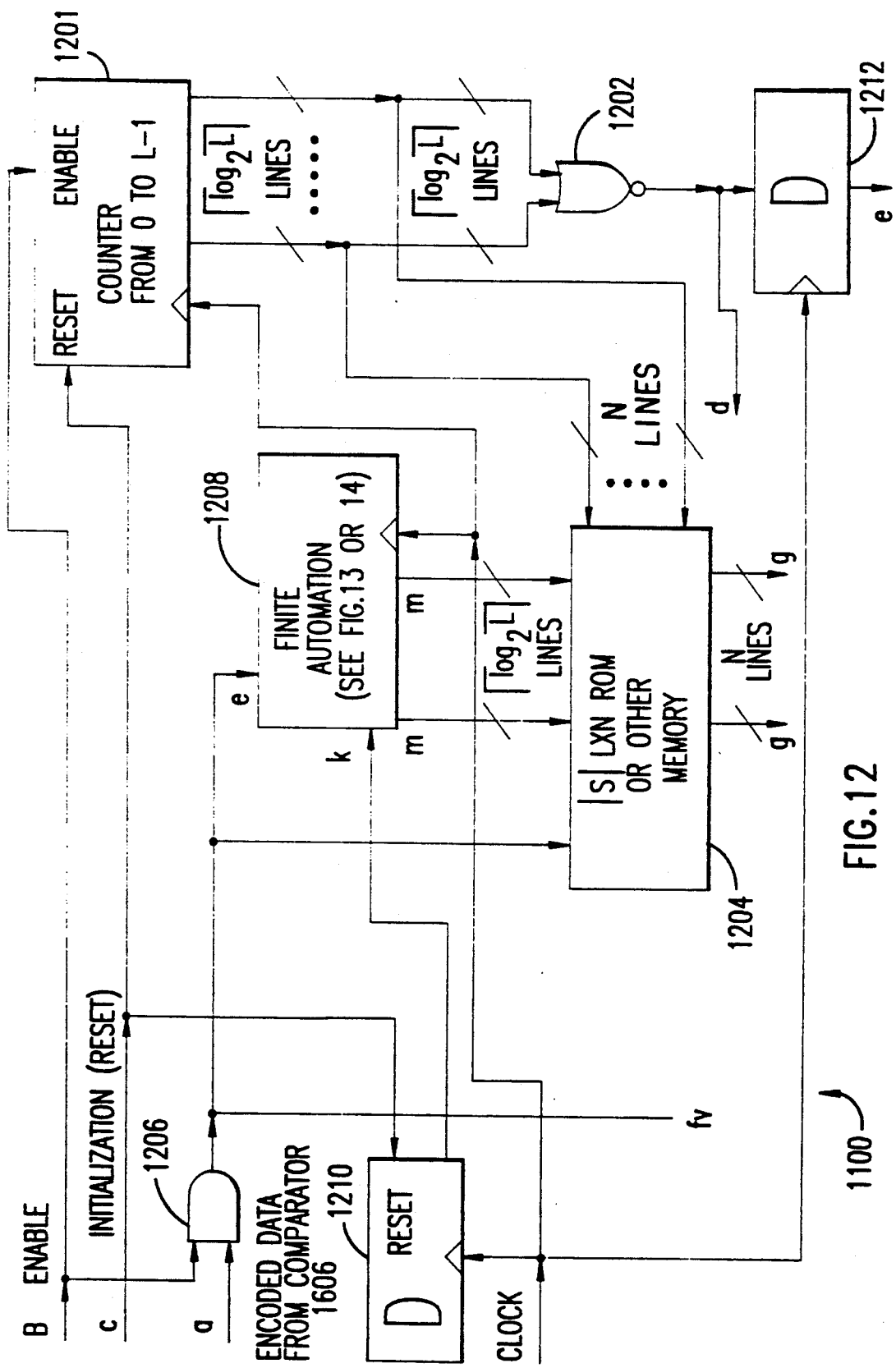
FIG. 12 is a schematic block diagram of the common part of the encoder and decoder illustrated in FIGS. 11 and 16, with a finite automation illustrated in FIG. 13, for the general case of constraints defined by any state transition table and for the specific case of run-length-limiting (d, k) constraints shown in FIG. 14.

FIG. 12 shows the circuitry of the common part of the encoder and decoder 1100 in more detail. A counter 1200, which counts from 0 to L−1, has connected to it both the enable and initialization signal lines described in connection with FIG. 11. In addition, the clock line is also connected to the clock input of the counter 1200. A $|\log_2 L|$ plurality of lines leave the counter and are connected to two inputs of NOR gate 1202 as well as to the inputs of ROM 1204 which contains the state transition table and array of accumulated numbers. The ROM is preferably of $|S| \times L \times N$ size. Any other appropriate memory device may also be used instead of ROM.

Figure 13:
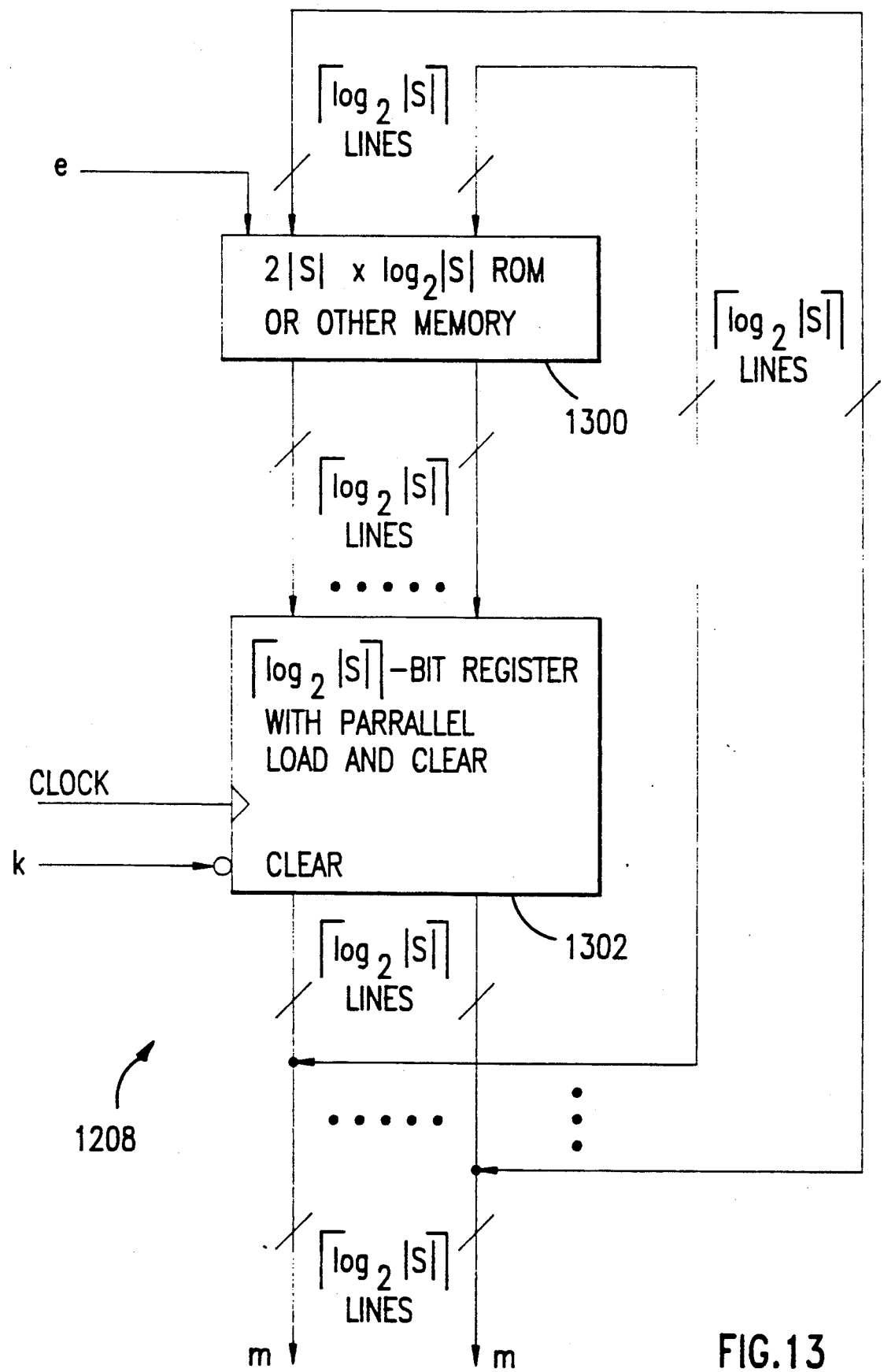
FIG. 13 shows a block diagram of the finite automation of FIG. 12 for the general case of an arbitrary state transition table stored in a ROM or other memory.

The encoded data and an enable signal are fed to the input of an AND gate 1206, whose output is both an input of the ROM 1204 and the e input to the finite automaton 1208. The finite automaton is shown in more detail in FIGS. 13 and 14. The circuitry of FIG. 13 is utilized as the finite automaton 1208 for the general case of constraints on codewords defined by an arbitrary state transition table stored in a ROM or other memory and is shown in FIG. 14 for the case of arbitrary run-length-limited (d, k) constraints.

The initialization signal is additionally applied to the reset input of a D type flip-flop 1210. The clock signal is applied to the clock inputs of a first D type flip-flop 1210, a second D type flip-flop and also to the finite automaton element 1208.

The output from the AND gate 1206, which is the encoded data, is fed to both the finite automaton 1208 and an input of the ROM 1204. The encoded data is also output directly from the AND gate 1206 as an output f.

The finite automaton 1208 is connected to the D type flip-flop 1210. The outputs m from the finite automaton 1208 correspond to $\log_2|S|$ lines and are connected to the input of the ROM 1204. The variables g are output on N lines from the ROM 1204.

In operation, encoded data is passed through the AND gate 1206 when the enable signal is present and appears on the input e of the finite automaton 1208. At the moment t, a bit b of the codeword is applied to the input e of the finite automaton 1208 and also to the e input of the 2Sx $\log_2|S|$ ROM 1300 of FIG. 13. At that same time t, the output of the bit register 1302 of FIG. 13 is the state s. That state s is applied to the other input of the ROM 1300. Those two inputs to the ROM 1300 constitute the address input of the ROM.

The output from the ROM 1300 is applied to the input of the parallel load and clear register 1302. The output of the register 1302 is the entry e(s,t) of the state transition table stored in the ROM 1300 and thus is the new value of the state s, s', of the finite automaton 1208. The output m from the register 1302, at time t+1, will thus be s'=e(s,t) and is the required output of the finite automaton 1208, as shown in FIG. 12.

FIG. 14 shows the structure of the finite automaton 1208 in the case of arbitrary RLL (d.k) constraints. For such a case, it is assumed that the state is the number of zeroes that have been processed after the last one of the currently being processed (for decoding) or to be obtained (encoding) codeword. Encoded data appears on the input e of the gate 1402 to the counter 1400 of FIG. 14. At that moment t, a bit b of the codeword is applied to the input e of that gate 1402. If that bit is a 0 and the state s at the moment t is less than k, then the new state s' at the moment t=1 will be s'=s+1. The case of the bit being 0 and the state being not less than k is forbidden by the (d,k) constraints. If this bit is a one, then the output of the gate 1402 will be high and hence that high signal will be applied to the reset of the counter 1400 which, at time t+1, will reset the counter 1400 to 0.

Referring now to FIG. 15, which is applicable for RLL constraints (d, k) of d=2, k=5, and codeword length L=12, the time diagrams of the various signals denoted in FIGS. 11-14 and 16 are shown.

When the circuitry has received both an enabling signal and an initiating signal and the clock is already running, the apparatus starts decoding the first codeword of L bits at initial state 0, which is shown as the leading edge of the second clock pulse of the clock signal at a. The clock is defined as moments of time following directly after one another of 0, 1, ..., t−1, t, t+1, .... The initialization signal sets the counter 1200 to 0, which counter outputs the number of processed bits of a codeword that has been processed. The initialization signal also sets the finite automaton 1208 to its initial state, which is the final state of the word constituted by the bits of the codeword that have been processed. If the finite automaton element 1208 is formed by the circuitry of FIG. 13, then the output of the $\log_2|S|$ bit register with parallel load and clear is set to 0's. If, on the other hand, the finite automaton circuit 1208 is formed from the circuitry of FIG. 14, then the output of the counter 1400 is set to 0.

Referring again to FIG. 11, the output signals d, f and g from the circuitry of FIG. 12 are fed respectively to the inputs of four AND gates 1106, 1108, 1114 and 1110. The output signal d from element 1100 is fed to one input of the N plurality of AND gates 1106, 1108. The output e is connected to the clear terminal of the N-bit register 1104. The AND gates 1114 and 1110, which represent N such AND gates whose output is N such lines, receive both the f and g signal at each of their respective inputs. The output from the AND gates 1114 and 1110 is fed via N lines to a like number of inputs in an N-bit parallel adder 1102. The N number of lines which form the output of the N-bit parallel adder 1102 are fed as the second input to N number of AND gates 1106, 1108, by N number of lines. The output from the N number of AND gates 1106, 1108 is the decoded data.

The output from the N-bit parallel adder 1102 is also fed along N number of lines to the input of an N-bit register with parallel load and clear functions 1104. The output of the N-bit register 1104, along N number of lines, is the variable g, the partial sum of the accumulated numbers which become the lexicographic number i of the codeword when all bits of the codeword have been processed. That number g is fed back using N number of lines to the input of the N-bit parallel adder 1102.

The input or encoded data is input into the common part of the encoder and decoder 1100 on input a. The decoded data, which is output from the plurality of AND gates 1106, 1108, are N-bits on N parallel lines modified in the end by any decoded codeword.

The N lines output from the terminals g of the common part of the encoder and decoder 1100 output the accumulated number, which is an entry as, 1 of the array of accumulated numbers, which is the array stored in the ROM 1204 shown in FIG. 12. If the circuitry of FIG. 14 is used as the finite automaton 1208 of FIG. 12, the output m along $\log_2|S|$ number of lines from the counter 1400 is the length of entries of the array of accumulated numbers.

Figure 16:
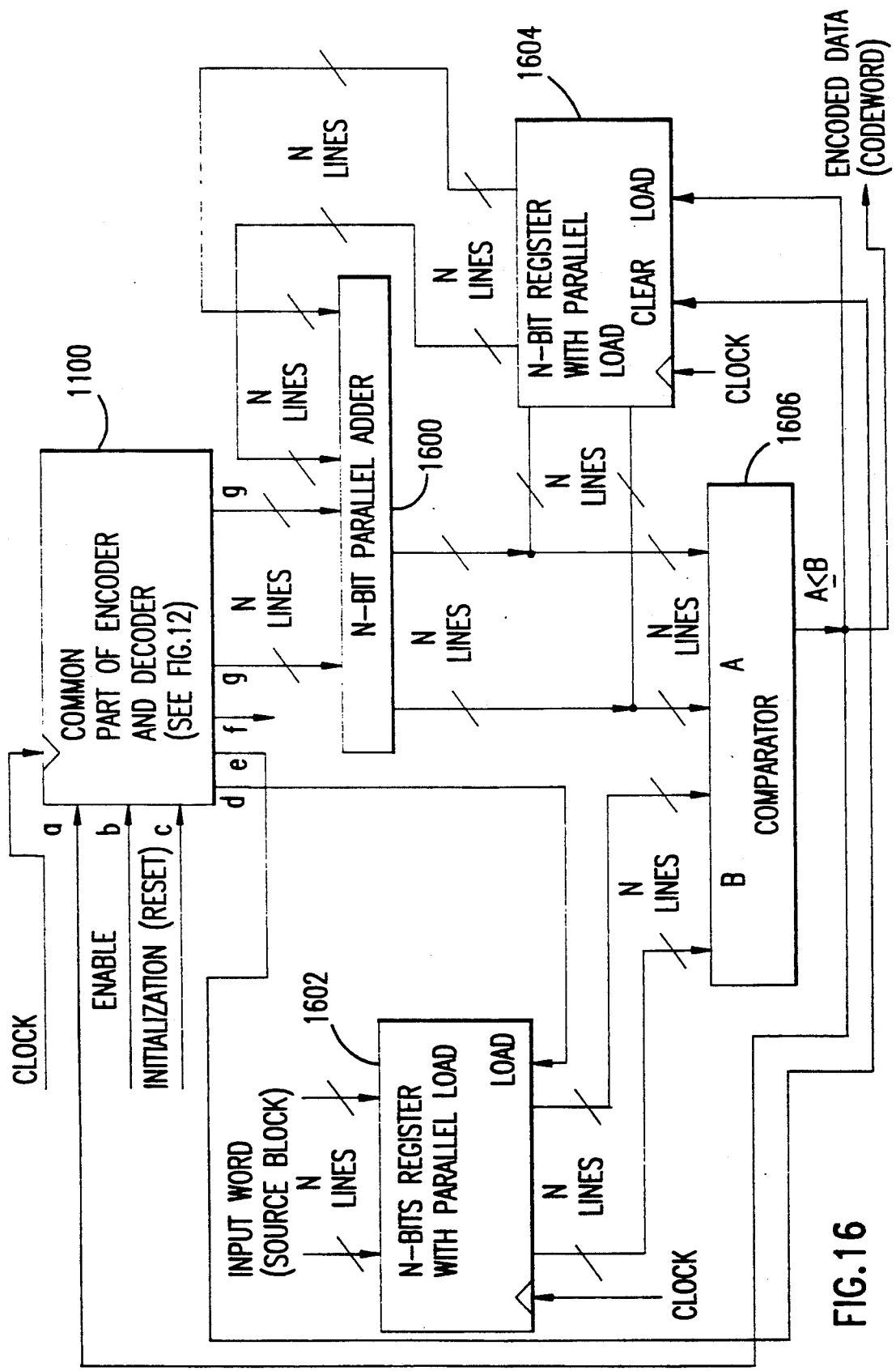
FIG. 16 shows a block diagram of an encoder corresponding to the decoder of FIG. 11 and which utilizes the common part of the encoder and decoder shown in FIG. 12.

In operation, the encoded data or data from the comparator 1606 of FIG. 16 passes through the AND gate 1206 shown in FIG. 12 once the enable signal is present and appears on the input e of the finite automaton 1208. The operation of the finite automaton, which may alternatively use the circuitry of either FIG. 13 or 14, has previously been described. At the moment t, a bit b of the codeword is applied to the input of the finite automaton 1208, whose output at that moment is a state s. At the moment t+1, the output state of the finite automaton 1208 will be, according to the state transition table, s'=e(s, t). This new state s' and the output from the counter 1200 is the number 1 of bits of the codeword which have already been processed. That is, the number 1 of bits which precede the last bit. The new state s and the output from the counter 1 are applied to the two inputs of the ROM 1204 or other appropriate storage device.

The output s' of the finite automaton 1208 at the moment t=1, which represents the state of the automaton 1208 at the moment t+1, and the output from the counter 1200 constitute the address input to the ROM 1204. The output from the ROM or other memory 1204 is the array of accumulated numbers entry $a_{s,1'}$, which corresponds to the address input applied to that memory 1204. If the bit of the codeword applied to the apparatus of the invention is equal to 1, then the array N of AND gates 1114, 1110 and the output of ROM 1204 is applied to the N-bit parallel adder 1102. The other number applied to the adder 1102 is the output from the N-bit register with parallel load and clear 1104, which represents the sum of the array of accumulated number entries accumulated at time t+1.

The output of the N-bit parallel adder 1102 is applied to the Nbit register 1104 for storage. At the end of the codeword, when the counter 1100 is reset to 0, the output from the NOR gates 1114, 1110 becomes equal to 0, which opens the array of AND gates 1106, 1108 and the output from the N-bit parallel adder 1102 appears at the output of the apparatus of the present invention as the decoded data or codeword (the recovered information source block).

Referring again to FIG. 12, the output from the $\log_2 L$ number of NOR gates 1202 is stored in the D type flip-flop 1212 and, at the next moment of time, clears the N-bit register 1104, thus preparing the register 1104 for the decoding of the next codeword.

FIG. 16 is a schematic block diagram of an encoder for use with a binary coding alphabet. Block 1100 of FIG. 16, which is the common part of the encoder and decoder, is shown in FIG. 12 and is described in connection with that figure. The finite automaton 1208 of FIG. 12 is shown and described in connection with FIG. 13 for the general case of an arbitrary state transition table and is shown and described in connection with FIG. 14 for the specific case of arbitrary run-length-limiting (d,k) constraints.

As is the case with the decoder shown and described in connection with FIGS. 12-15, the encoder utilizes a precalculated state transition table and an array of accumulated numbers, which are stored in a ROM or other memory, as has been previously described. The same state transition table and array are used for the corresponding encoder, such as is shown in FIG. 16.

The encoder of FIG. 16 implements Algorithms 7 or 8, which incorporate Algorithm 2, as has been described. As has also been described, each of the Algorithms 7 and 8 are accomplished by utilizing the Algorithms 4 and 3 from the given state transition table, given the same initial and final state for Algorithm 7, or for all initial and final states for Algorithm 8, and the length N of output words (recovered information source blocks). The same notation previously described in connection with the decoder also applies to the encoder, which is more fully illustrated by the block diagrams of FIGS. 16 and 12-14 and the waveforms of FIG. 15.

The encoder shown in FIG. 16 will now be discussed. However, the discussion will include only so much of the operation of FIGS. 11-14 as is necessary for an understanding of FIG. 16, since those figures have previously been discussed and since those figures form one of the elements of FIG. 16, namely the common part of the encoder and decoder 1100.

As shown in FIG. 16, the common part of the encoder 1100 receives clock, enable and initialization signals as the clock, enable and initialization inputs of the common part of the encoder 1100. The time diagrams for those signals are shown in FIG. 15. After initialization, the N-bit input word or source block appears at the input of the parallel load register 1602 and the apparatus shown in FIG. 16 starts encoding by sequentially producing bits of a codeword during each clock cycle defined by 0, 1, ..., t−1, t+1, ... The initialization signal performs the same function with respect to the circuitry of FIGS. 12-14 as has previously been described.

The initialization signal sets to 0 the outputs of the finite automaton 1208 and the counter 1200. The state of the finite automaton 1208 is the final state of the word constituted by the bits of the codeword that have been processed. Therefore, the signal output from the common part of the encoder 1100 on the N lines in FIG. 16 to the N-bit parallel adder 1600 is the accumulated number, an entry $a_{s,1}$ of the array of accumulated numbers, which is the array stored in the S . L×N ROM or other memory 1204. In the case where the circuitry of FIG. 14 is used, that output is the output of the counter 1400. Thus, the output of the N-bit register 1104 which receives the output from the parallel adder 1102 is a number g, which is the partial sum of the accumulated numbers, which becomes the lexicographic number i of the codeword when all of the bits of the codeword have been processed.

The input data or input source blocks appear as L parallel bits on the input of the register 1104. The output data or codewords are L sequential bits produced at the output of the comparator 1606, in L sequential clock cycles.

In operation, the circuitry of FIG. 16 operates as follows. The N-bit input information source block appears on the input of the parallel load N-bit register 1602. As has been previously described, the bits of a codeword appear on the input e of the finite automaton 1208. That is because the output from the comparator 1606 is connected to the input a of the AND gate 1206. At time t, a bit b of the codeword is produced at the output of the comparator 1606 and is applied to the input e of the finite automaton 1208. At the same time, the output of the finite automaton is a state s. At the time t+1, the output state of the finite automaton 1208 is, according to the state transition table, the state s'=e(s,t).

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. Apparatus for providing modulation decoding of a modulation encoded codeword having an L plurality of bits comprising:

means for receiving each of said bits of said modulated encoded codeword for producing a signal representative of the state of each bit of at least one codeword;

storage means connected to receive said signal representative of the state of each bit of said at least one codeword, as well as a signal representative of a number of such bits that have been processed, said storage means producing a signal representative of an element in a predetermined array of accumulated numbers held in said storage means;

first adding means connected to receive said signal representative of an element in said predetermined array as well as each of the bits of said modulation encoded codeword;

means for storing an output of said first adding means;

means connecting an output of said means for storing to inputs of said first adding means; and means for receiving the output of said first adding means and said signal representative of the number of bits that have been processed, and outputting the desired modulation decoded codeword.

2. The apparatus of claim 1, further including second adding means adding said signal representative of an element in said predetermined array to a signal representative of the bit to which said signal representative of an element in said predetermined array corresponds and having an output connected to the inputs of said first adding means.

3. The apparatus of claim 2, wherein the output of said second adding means and the output of said means for storing are connected to adjacent inputs of said first adding means.

4. The apparatus of claim 1, wherein said first adding means comprises a parallel adder.

5. The apparatus cf claim 1, wherein said means for storing the output of said first adding means comprises a parallel load and clear register.

6. The apparatus of claim 1, wherein said storage means comprises a read-only memory.

7. Apparatus for providing encoding of a block of user data of length N, which block of user data is formed by a plurality of codewords each of length L, comprising:

means for receiving bits of each of said codewords of said block of user data for producing a signal representative of the state of each bit of at least one codeword;

storage means connected to receive said signal representative of the state of each bit of said at least one codeword, as well as a signal representative of the number of such bits that have been processed, said storage means producing a signal representative of an element in a predetermined array of accumulated numbers held in said storage means;

first adding means connected to receive said signal representative of an element in said predetermined array;

first means for storing connected to the output of said first adding means for storing and then outputting to said first adding means said stored output of said first adding means;

second means for storing connected to receive each of said plurality of codewords which form said block of user data, as well as said signal representative of the number of bits that have been processed; and comparator means connected to receive the output from said first adding means and said second means for comparing said outputs and providing an encoded codeword whenever said output of said first adding means is less than or equal to the output of said second means for storing.

8. The apparatus of claim 7, wherein said first adding means comprises a parallel adder.

9. The apparatus of claim 7, wherein said first and second storage means comprise parallel load and clear registers.

10. The apparatus of claim 7, wherein said storage means comprises a read-only memory.

* * * * *